US012094927B2

(12) United States Patent
Chen et al.

(10) Patent No.: US 12,094,927 B2
(45) Date of Patent: Sep. 17, 2024

(54) SOURCE/DRAIN ISOLATION STRUCTURES FOR LEAKAGE PREVENTION

(71) Applicant: Taiwan Semiconductor Manufacturing Co., Ltd., Hsinchu (TW)

(72) Inventors: Yen-Yu Chen, Taichung (TW); Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/815,999

(22) Filed: Jul. 29, 2022

(65) Prior Publication Data

US 2022/0367621 A1 Nov. 17, 2022

Related U.S. Application Data

(62) Division of application No. 16/877,800, filed on May 19, 2020, now Pat. No. 11,532,702.

(51) Int. Cl.
*H01L 29/06* (2006.01)
*H01L 21/8234* (2006.01)
(Continued)

(52) U.S. Cl.
CPC .. *H01L 29/0653* (2013.01); *H01L 21/823431* (2013.01); *H01L 29/41791* (2013.01);
(Continued)

(58) Field of Classification Search
CPC ......... H01L 29/0653; H01L 21/823431; H01L 29/41791; H01L 29/66795; H01L 29/785;
(Continued)

(56) References Cited

U.S. PATENT DOCUMENTS 9,881,998 B1 * 1/2018 Cheng .............. H01L 29/42392
10,367,061 B1 7/2019 Loubet
(Continued)

FOREIGN PATENT DOCUMENTS

CN 109427905 A 3/2019
CN 110718588 A 1/2020
(Continued)

OTHER PUBLICATIONS

Office Action directed to related Taiwanese Patent Application No. 110105978, mailed Dec. 15, 2021, with attached English-language translation; 7 pages.
(Continued)

*Primary Examiner* — Cuong B Nguyen
(74) *Attorney, Agent, or Firm* — Sterne, Kessler, Goldstein & Fox P.L.L.C.

(57) ABSTRACT

The present disclosure is directed to gate-all-around (GAA) transistor structures with a low level of leakage current and low power consumption. For example, the GAA transistor includes a semiconductor layer with a first source/drain (S/D) epitaxial structure and a second S/D epitaxial structure disposed thereon, where the first and second S/D epitaxial structures are spaced apart by semiconductor nano-sheet layers. The semiconductor structure further includes isolation structures interposed between the semiconductor layer and each of the first and second S/D epitaxial structures. The GAA transistor further includes a gate stack surrounding the semiconductor nano-sheet layers.

20 Claims, 23 Drawing Sheets

(51) Int. Cl.
   *H01L 29/417*     (2006.01)
   *H01L 29/66*      (2006.01)
   *H01L 29/78*      (2006.01)

(52) U.S. Cl.
   CPC ...... *H01L 29/66795* (2013.01); *H01L 29/785* (2013.01); *H01L 2029/7858* (2013.01)

(58) Field of Classification Search
   CPC ....... H01L 2029/7858; H01L 21/02164; H01L 21/02236; H01L 29/42376; H01L 29/0673; H01L 29/42392; H01L 29/66439; H01L 29/66545; H01L 29/78696; H01L 29/0665; H01L 29/0847; H01L 21/7624; B82Y 10/00; B82Y 40/00
   See application file for complete search history.

(56) References Cited

U.S. PATENT DOCUMENTS

| | | |
|---|---|---|
| 10,403,550 B2 | 9/2019 | Chiang et al. |
| 10,468,532 B1 | 11/2019 | Reznicek et al. |
| 10,811,415 B2 | 10/2020 | Sengupta et al. |
| 11,038,043 B2 | 6/2021 | Cheng et al. |
| 11,855,090 B2 | 12/2023 | Ohtou et al. |
| 2006/0249784 A1 | 11/2006 | Black et al. |
| 2011/0062421 A1 | 3/2011 | Iwayama et al. |
| 2016/0163796 A1 | 6/2016 | Obradovic et al. |
| 2018/0204955 A1 | 7/2018 | Mehandru et al. |
| 2019/0019681 A1 | 1/2019 | Wong et al. |
| 2019/0081155 A1 | 3/2019 | Xie et al. |
| 2019/0081160 A1 | 3/2019 | Suh et al. |
| 2019/0189769 A1 | 6/2019 | Basker et al. |
| 2020/0052124 A1 | 2/2020 | Miao et al. |
| 2020/0091287 A1* | 3/2020 | Glass .................. H01L 29/1079 |
| 2020/0105902 A1 | 4/2020 | Ching et al. |
| 2020/0105929 A1 | 4/2020 | Zhang et al. |
| 2020/0279918 A1 | 9/2020 | Wu et al. |
| 2020/0295198 A1 | 9/2020 | Cheng et al. |
| 2020/0343372 A1 | 10/2020 | Yu et al. |
| 2020/0373411 A1* | 11/2020 | Lee .................... H01L 21/3083 |
| 2021/0202716 A1* | 7/2021 | Lin .................... H01L 21/02063 |

FOREIGN PATENT DOCUMENTS

| | | |
|---|---|---|
| CN | 111106110 A | 5/2020 |
| KR | 20190030270 A | 3/2019 |
| KR | 20200014235 A | 2/2020 |
| TW | 201631771 A | 9/2016 |
| TW | 201719901 A | 6/2017 |
| TW | 201914951 A | 4/2019 |
| TW | 202018783 A | 5/2020 |

OTHER PUBLICATIONS

Office Action, dated Dec. 22, 2023, First Office Action App. No. 20211038514.1, 12 pages.

* cited by examiner

300

```
┌─────────────────────────────────────────────────┐
│ Form alternating first and second nano-sheet    │ ~ 305
│ layers on a substrate                           │
└─────────────────────────────────────────────────┘
                        ▼
┌─────────────────────────────────────────────────┐
│ Pattern the first and second nano-sheet layers  │ ~ 310
│ to form a vertical nano-sheet layer structure   │
└─────────────────────────────────────────────────┘
                        ▼
┌─────────────────────────────────────────────────┐
│ Form a sacrificial gate structure over the      │ ~ 315
│ vertical nano-sheet layer structure             │
└─────────────────────────────────────────────────┘
                        ▼
┌─────────────────────────────────────────────────┐
│ Remove portions of the vertical nano-sheet      │ ~ 320
│ layer structure not covered by the sacrificial  │
│ gate structure                                  │
└─────────────────────────────────────────────────┘
                        ▼
┌─────────────────────────────────────────────────┐
│ Partially etch the first nano-sheet layers from │ ~ 325
│ the vertical nano-sheet layer structure         │
└─────────────────────────────────────────────────┘
                        ▼
┌─────────────────────────────────────────────────┐
│ Deposit a capping layer on the vertical nano-   │ ~ 330
│ sheet layer structure                           │
└─────────────────────────────────────────────────┘
                        ▼
                       (A)
```

FIG. 3A

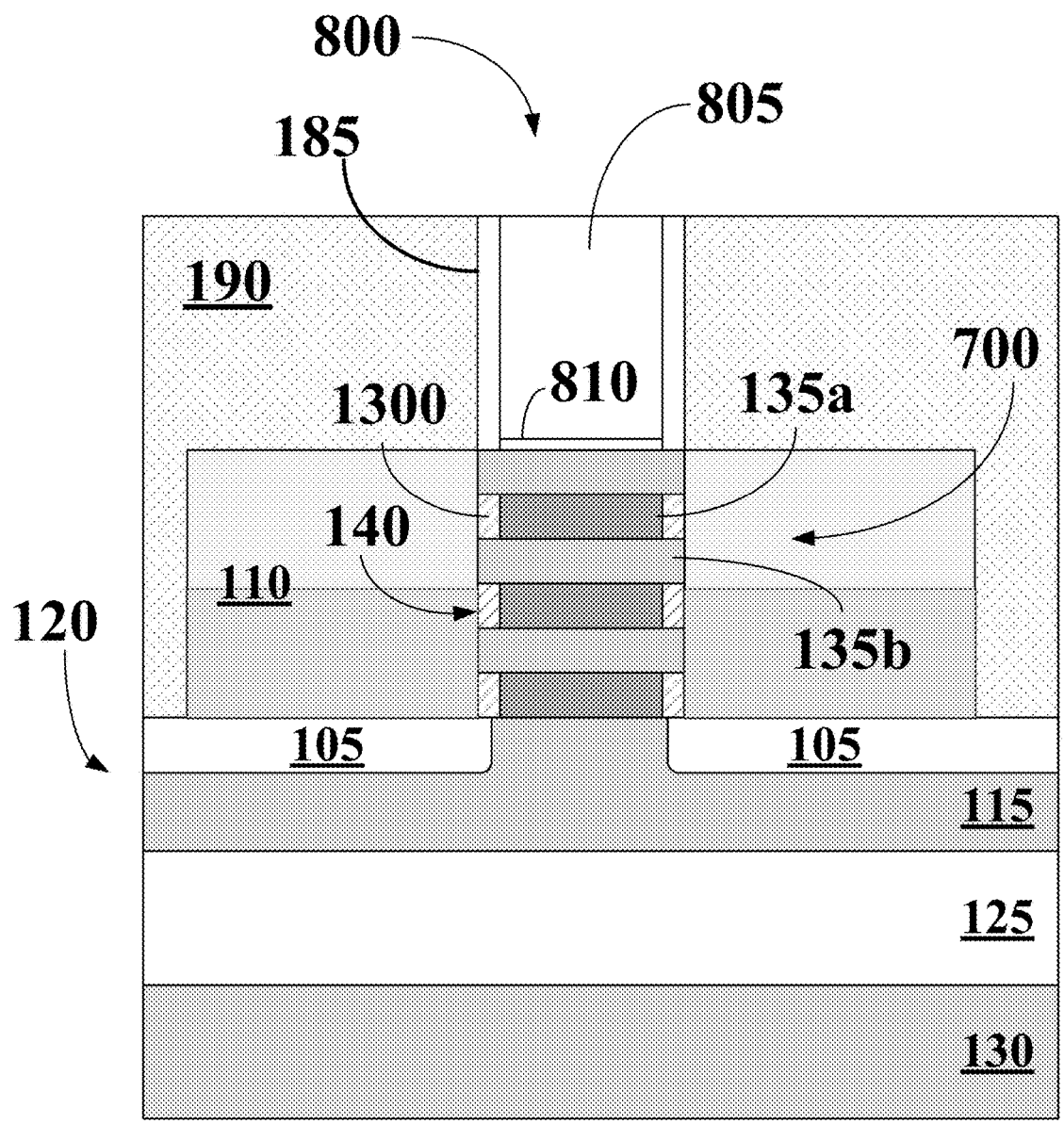
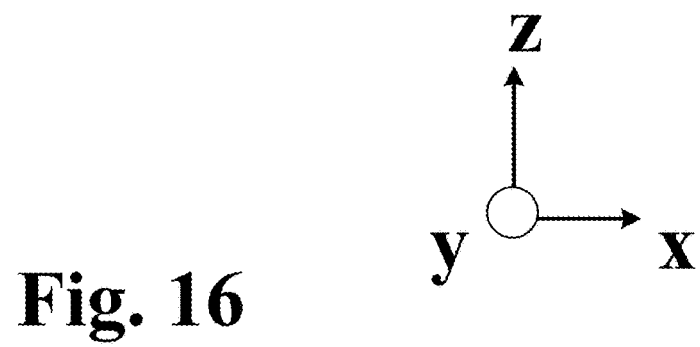

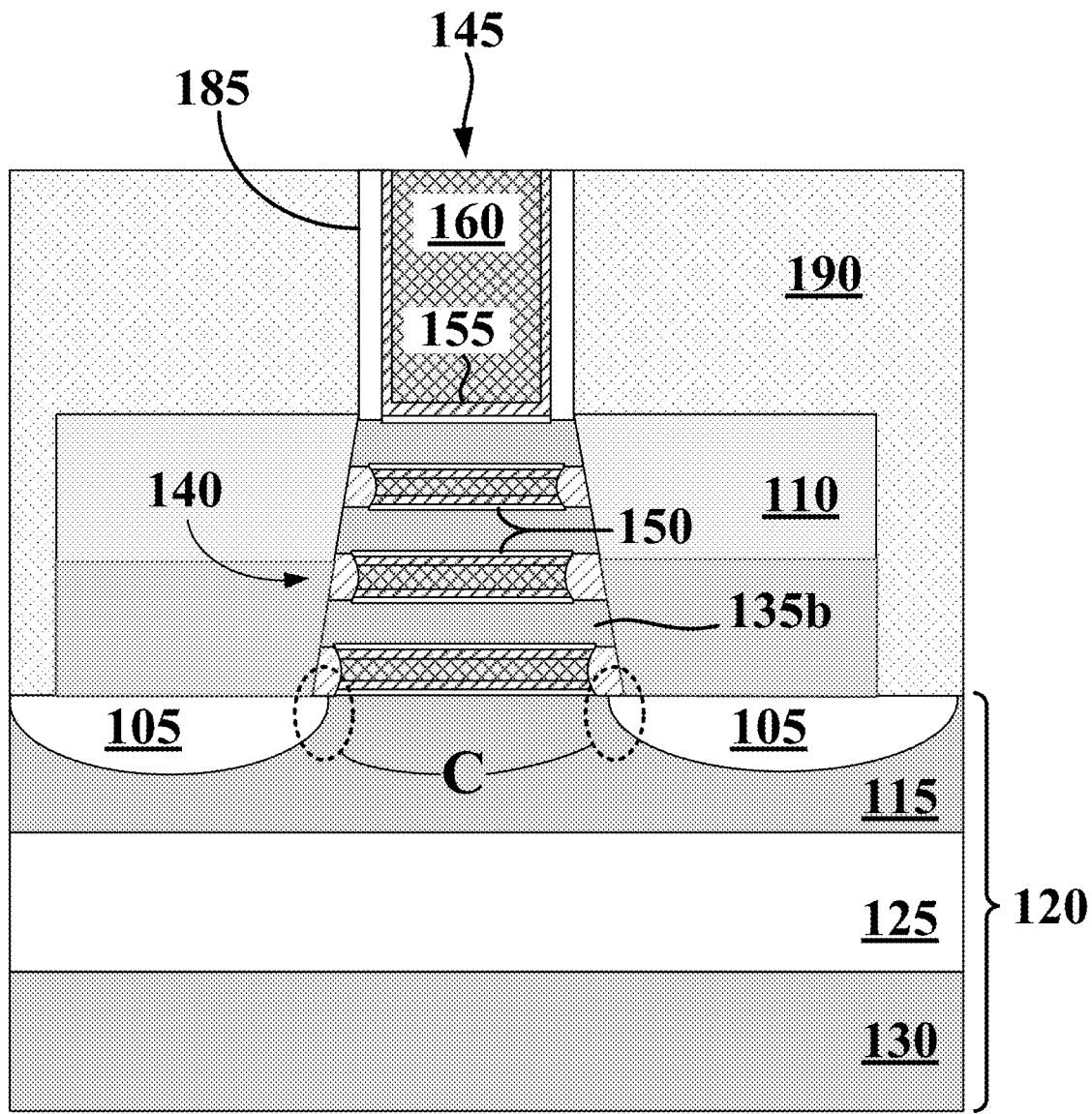
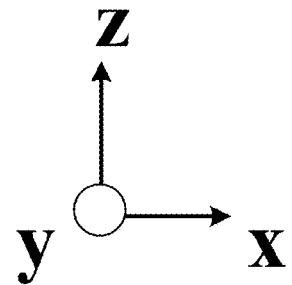
Fig. 21

SOURCE/DRAIN ISOLATION STRUCTURES FOR LEAKAGE PREVENTION

CROSS-REFERENCE TO RELATED APPLICATIONS

This application is a divisional of U.S. patent application Ser. No. 16/877,800, titled "Source/Drain Isolation Structures for Leakage Prevention," filed May 19, 2020, which is incorporated herein by reference in its entirety.

BACKGROUND

The source/drain regions in fin-based field effect transistors (finFETs) are grown from side surfaces of the fin structures and a top surface of the semiconductor substrate on which the fin structures are formed. During operation, a leakage path can be formed between the source/drain regions and the semiconductor substrate. The leakage path can degrade the finFET's performance.

BRIEF DESCRIPTION OF THE DRAWINGS

Aspects of the present disclosure are best understood from the following detailed description when read with the accompanying figures.

FIGS. 3A and 3B are flow diagrams of a method for the fabrication of a gate-all-around nano-sheet FET, in accordance with some embodiments.

FIGS. 11-20 are cross-sectional views of intermediate structures during the fabrication of a gate-all-around nano-sheet FET, in accordance with some embodiments.

FIG. 21 is a cross-sectional view of a gate-all-around nano-sheet FET, in accordance with some embodiments.

DETAILED DESCRIPTION

Figure 1:
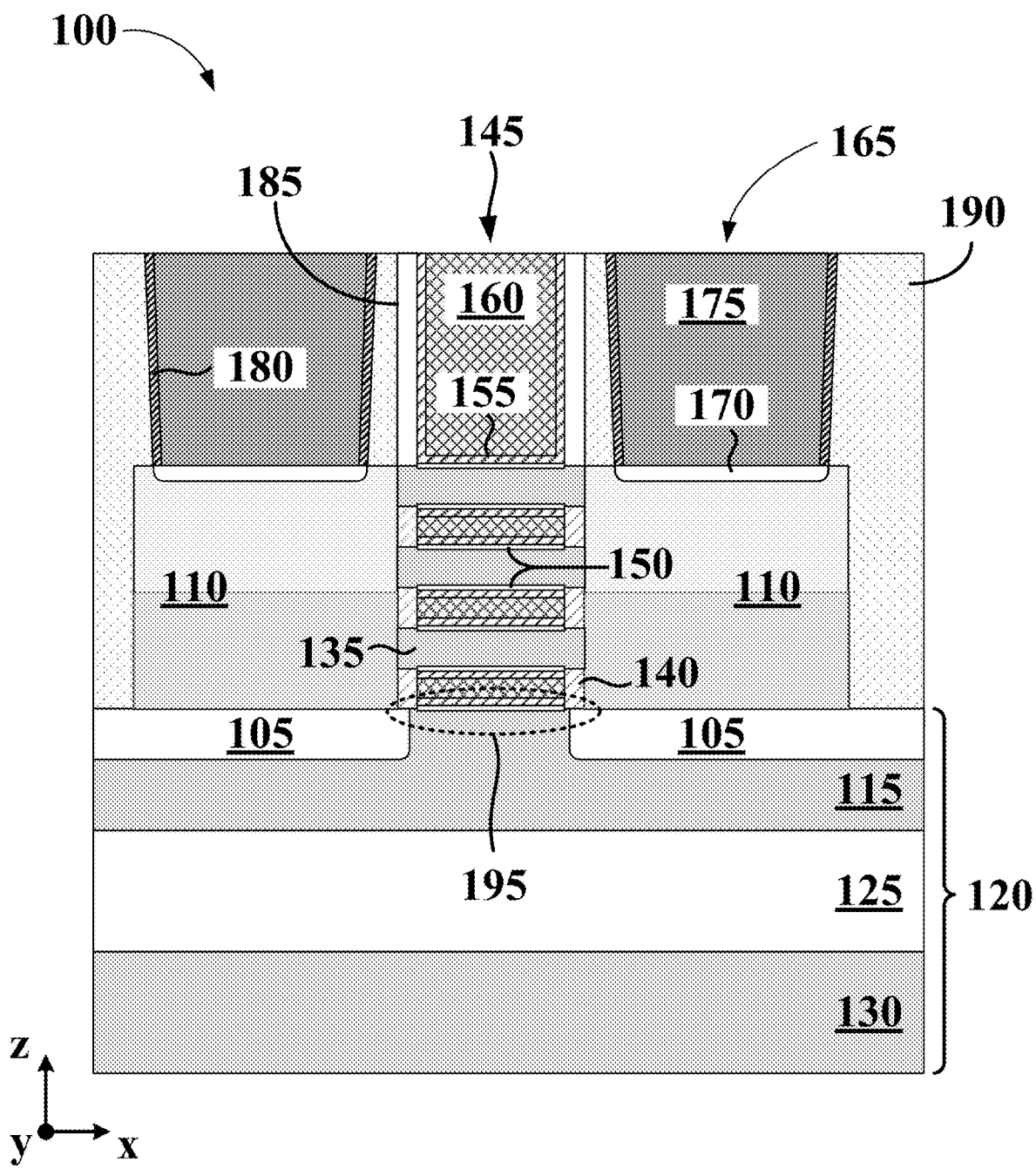
FIG. 1 is a cross-sectional view of gate-all-around nano-sheet FETs on a semiconductor-on-insulator substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

The term "vertical," as used herein, means nominally perpendicular to the surface of a substrate.

The term "insulating layer", as used herein, refers to a layer that functions as an electrical insulator (e.g., a dielectric layer).

Gate-all-around (GAA) field effect transistors (GAA-FETs), such as nano-sheet or nano-wire GAA-FETs, have an improved gate control over their channel region compared to other types of FETs whose gate structure covers sidewall portions and top surfaces of a semiconductor fin structure. Due to their gate-all-around geometry, GAA nano-sheet or nano-wire FETs achieve larger effective channel widths and higher drive currents. At the same time, their distinct geometry makes GAA nano-sheet or nano-wire FETs susceptible to leakage current. For example, the gate electrode, which wraps around the nano-sheets of the FET, is formed in close proximity to the semiconductor substrate. Consequently, during operation of the GAA FETs, a parasitic channel can be formed within the semiconductor substrate between source/drain terminals grown directly on the semiconductor substrate. This parasitic channel can degrade the performance of the GAA FET and increase power consumption. To suppress the parasitic channel formation, the semiconductor substrate is "counter-doped"—e.g., doped with a dopant type opposite to the dopant type present in the channel region of the nano-sheet or nano-wires. Doping the semiconductor substrate adds cost to the manufacturing process and/or may not effectively eliminate or suppress the parasitic channel formation.

The embodiments described herein are directed to methods for the fabrication of GAA FETs with low power consumption that may not require substrate doping (e.g., counter-doping). In some embodiments, isolation structures electrically isolate the source/drain epitaxial layers of the GAA FET from the semiconductor substrate, mitigate or eliminate leakage currents, and eliminate the need for substrate doping (e.g. counter-doping). In some embodiments, prior to the formation of the source/drain epitaxial layers, the semiconductor substrate is exposed to an oxygen treatment (e.g., directional decoupled plasma oxidation (DDPO)) so that an isolation structure is formed in a top portion of an un-doped semiconductor substrate. Subsequently, the source/drain epitaxial layers are formed on the isolation structure.

FIG. 1 is a cross-sectional view of a GAA nano-sheet or nano-wire FET structure 100 (GAA FET 100), according to some embodiments. GAA FET 100 features isolation structures 105 interposed between source/drain (S/D) epitaxial layers 110 and a semiconductor layer 115 and has a low power consumption compared to a GAA FET without isolation structures 105. S/D epitaxial layers 110 in GAA FET 100 are electrically decoupled from semiconductor layer 115. In some embodiments, semiconductor layer 115 is an un-doped top layer of a semiconductor-on-insulator (SOI) substrate 120a. Alternatively, semiconductor layer 115 can be doped. By way of example and not limitation, the dopant concentration in semiconductor layer 115 can range between about $2 \times 10^{14}$ cm$^3$ and about $1 \times 10^{15}$ cm$^3$. SOI substrate 120 further includes a buried oxide (BOX) layer 125 disposed on a bulk substrate 120. S/D epitaxial layers 110 are formed in physical contact with semiconductor nano-sheets or nano-wires 135 which are separated by spacer structures 140 and are surrounded by gate stack 145 as shown in FIG. 1. In some embodiments, gate stack 145 can include an interfacial layer (IL) 150, a high-k dielectric 155, and a gate electrode 160. In some embodiments, gate electrode 160 further includes work function layers and metal fill layers not shown in FIG. 1 for simplicity. GAA FET 100 further includes S/D contacts 165 disposed on S/D epitaxial layers 110 with a silicide layer 170 formed therebetween. Each S/D contact 165 further includes conductive material 175 and liner 180 as shown in FIG. 1. In GAA FET 100, gate spacers 185 provide electrical isolation to gate stack 145 and interlayer dielectric (ILD) 190 provides electrical isolation to S/D contacts 165 and S/D epitaxial layers 110.

In some embodiments, and for a gate bias greater than a threshold voltage of GAA FET 100, a conductive channel is formed within semiconductor nano-sheets or nano-wires 135. Assuming an appropriate bias is applied to S/D epitaxial layers 110 via S/D contacts 165, current flows between S/D epitaxial layers 110 through the channel formed within semiconductor nano-sheets or nano-wires 135. During the above operating condition, a portion of gate stack 145 closest to semiconductor layer 115 can form a parasitic FET 195. If epitaxial layers 110 were in physical contact with semiconductor layer 115 (e.g., isolation structures 105 were not formed), an unwanted leakage current could flow between S/D epitaxial layers 110 via semiconductor layer 115. In some embodiments, isolation structures 105 thicker than about 10 nm (e.g., about 40 nm) can offer adequate electrical isolation to S/D epitaxial layers 110 and leakage current suppression. Further, isolation structures 105 thicker than about 10 nm (e.g., about 40 nm) can eliminate the need for counter-doping in semiconductor layer 115. In some embodiments, isolation structures 105 have a thickness substantially equal to the thickness of semiconductor layer 115 shown in FIG. 1 (e.g., between about 20 nm and about 200 nm).

Figure 2:
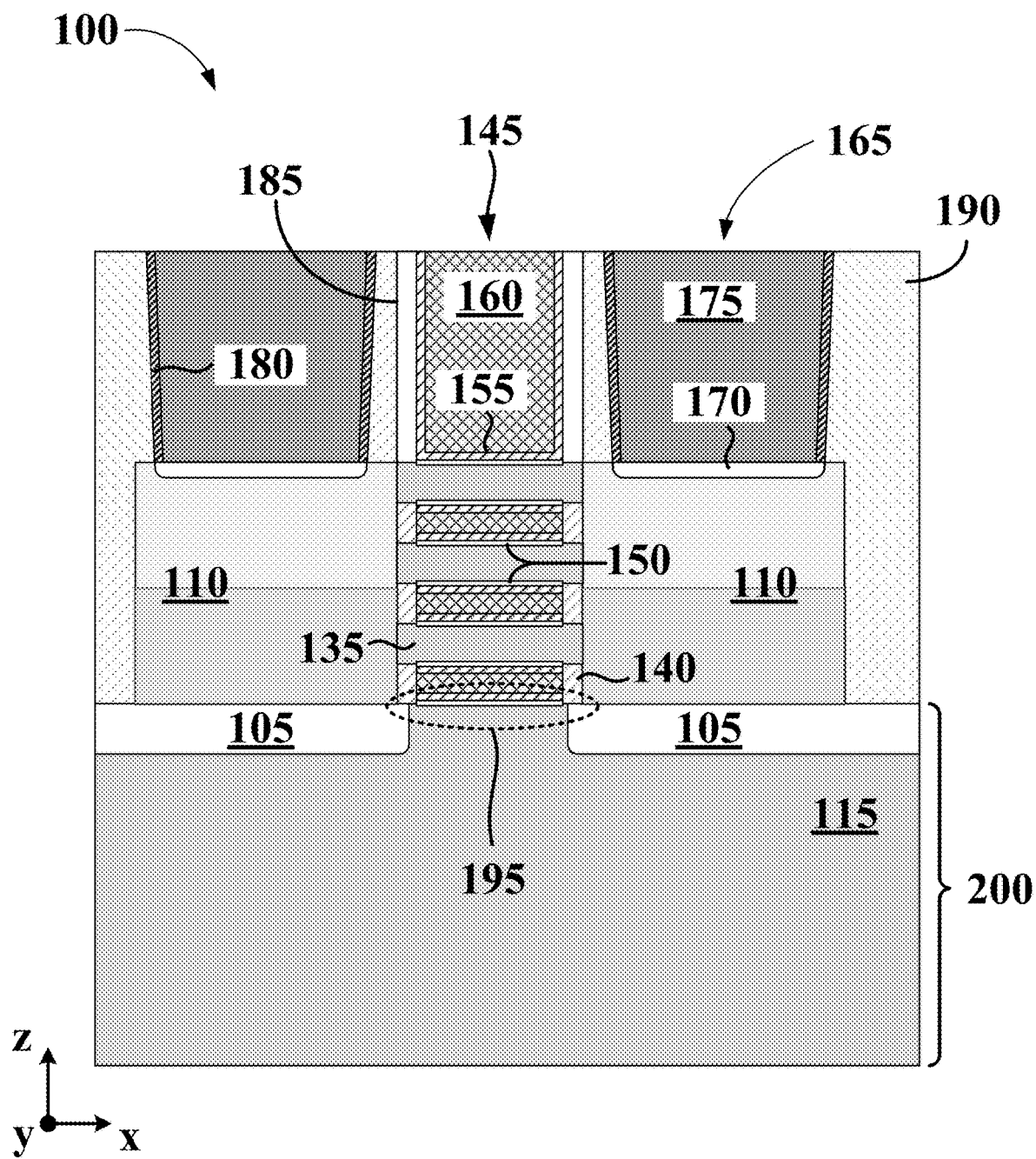
FIG. 2 is a cross-sectional views of gate-all-around nano-sheet FETs on a bulk semiconductor substrate, in accordance with some embodiments.

In some embodiments, GAA FET 100 is formed on a bulk semiconductor substrate 200 (e.g., as opposed to SOI substrate 120) as shown in FIG. 2. In some embodiments, SOI substrate 120 can more effectively suppress parasitic capacitances compared to semiconductor substrate 200. In some embodiments, semiconductor layer 115 of SOI substrate 120 or bulk semiconductor substrate 200 includes crystalline silicon (Si) or another elementary semiconductor, such as germanium (Ge). Alternatively, semiconductor layer 115 may include (i) a compound semiconductor like silicon carbide (SiC), gallium arsenide (GaAs), gallium phosphide (GaP), indium phosphide (InP), indium arsenide (InAs), and/or indium antimonide (InSb); (ii) an alloy semiconductor like silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, GAA FET 100 will be described in reference to FIG. 1 and semiconductor layer 115 of SOI substrate 120 will be described in the context of crystalline silicon (Si). Based on the disclosure herein, other substrates and other substrate materials, as discussed above, can be used. These other substrates and substrate materials are within the spirit and scope of this disclosure.

Assuming that semiconductor layer 105 includes Si, isolation structures 105 can include, for example, silicon oxide (SiO$_2$). Semiconductor layer 105 is not limited to silicon oxide and other insulating oxides are possible based on the material selection for semiconductor layer 115 (e.g., germanium oxide). Further, nitrides or other suitable dielectric materials (e.g., carbides) with a resistivity higher than about $1 \times 10^{10}$ Ohms·m can be used. These other insulating materials are within the spirit and the scope of this disclosure.

In some embodiments, for a p-type GAA FET, S/D epitaxial layers 110 include boron-doped (B-doped) silicon-germanium (SiGe), B-doped germanium (Ge), B-doped germanium-tin (GeSn), or combinations thereof. In some embodiments, for an n-type GAA FET, S/D epitaxial layers 110 include arsenic (As) or phosphorous (P)-doped silicon (Si), carbon-doped silicon (Si:C), or combinations thereof. In some embodiments, S/D epitaxial layers 110 can include two or more epitaxially-grown layers, which are not shown in FIGS. 1 and 2 for simplicity. In some embodiments, S/D epitaxial layers 110 are grown from exposed sidewall surfaces of semiconductor nano-sheets or nano-wires 135 (e.g., semiconductor nano-sheets or nano-wires 135 function as a seed for the semiconductor nano-sheets or nano-wires).

In some embodiments, semiconductor nano-sheets or nano-wires 135 are referred to as "nano-sheets" when their width along the y-direction is substantially different from their height along z-direction (e.g., when the width is larger/narrower than their height). In some embodiments, semiconductor nano-sheets or nano-wires 135 are referred to as "nano-wires" when their width along the y-direction is substantially equal to their height along z-direction. By way of example and not limitation, semiconductor nano-sheets or nano-wires 135 will be described in the context of nano-sheets. Based on the disclosure herein, semiconductor nano-wires, as discussed above, are within the spirit and the scope of this disclosure.

In some embodiments, each semiconductor nano-sheet layer 135 has a vertical thickness (e.g., along the z-direction) between about 5 nm and about 8 nm, and a width along the y-direction between about 15 nm and about 150 nm. Neighboring semiconductor nano-sheet layers 135 are vertically separated by a space that ranges between about 8 nm and about 12 nm. In some embodiments, semiconductor nano-sheet layers 135 include Si or SiGe with a Ge atomic concentration between about 20% and about 30%. Alternatively, semiconductor nano-sheets 135 can include III-V compound semiconductors, such as GaAs, InP, GaP, GaN, etc. For example purposes, semiconductor nano-sheet layers 135 will be described in the context of Si and SiGe nano-sheet epitaxial layers. Based on the disclosure herein, other materials, as discussed above, can be used and are within the spirit and scope of this disclosure. In some embodiments, GAA FET 100 can include between 2 and 8 individual semiconductor nano-sheet layers 135 depending on the FET's characteristics. Additional semiconductor nano-sheet layers 135 are possible.

In some embodiments, semiconductor nano-sheet layers 135 are lightly doped or undoped. If lightly doped, the doping level of semiconductor nano-sheet layers 135 is less than about $10^{13}$ atoms/cm$^3$.

As discussed above with respect to FIG. 1, the space between semiconductor nano-sheet layers 135 is occupied by the layers of gate stack 145—for example, IL 150, high-k dielectric 155, and gate electrode 160. In some embodiments, gate stack 145 covers a middle portion of semiconductor nano-sheet layers 135. Edge portions of semiconductor nano-sheet layers 135 are covered by spacer structures 140. In some embodiments, spacer structures 140 include a nitride, such as silicon nitride ($Si_3N_4$ or "SiN"), silicon carbon nitride (SiCN), and silicon carbon oxy-nitride (SiCON). In some embodiments, the width of spacer structures 140 along the x-direction ranges between about 5 nm and about 10 nm. As shown in FIG. 1, spacer structures 140 are interposed between gate stack 145 and S/D epitaxial layers 110 to electrically isolate gate stack 145 from S/D epitaxial layers 110.

Silicide layers 170, which are interposed between S/D contacts 165 and S/D epitaxial layers 110, can include titanium silicide (TiSi), nickel silicide (NiSi), cobalt silicide (CoSi), platinum-silicide (PtSi), or a suitable silicide material. By way of example and not limitation, each silicide layer 170 can have a thickness between about 4 nm and about 8 nm. In some embodiments, silicide layer 170 reduces the contact resistance between conductive material 175 and S/D epitaxial layers 110.

In some embodiments, conductive material 175 can include tungsten (W), cobalt (Co), ruthenium (Ru), molybdenum (Mo), or another suitable conductive material. In some embodiments, a liner 180 covers sidewalls surfaces of conductive material 175 and functions as an adhesive layer and/or as a barrier layer for conductive material 175. In some embodiments, liner 180 can include Ti, TiN, or other suitable materials.

As shown in FIG. 1, gate spacers 185 cover sidewall surfaces of gate stack 145 disposed on the topmost semiconductor nano-sheet 135. Gate spacers 185, like spacers structures 140, can include a nitride, such as SiN, SiCN, and SiCON. In some embodiments, gate spacers 185 facilitate the formation of gate stack 145.

In some embodiments, ILD 190 includes one or more layers of dielectric material. In some embodiments, ILD 190 is a silicon oxide based dielectric with nitrogen, hydrogen, carbon, or combinations thereof. According to some embodiments, ILD 190 provides electrical isolation and structural support to gate stack 145, S/D contacts 165, and S/D epitaxial layers 110.

Figure 3B:
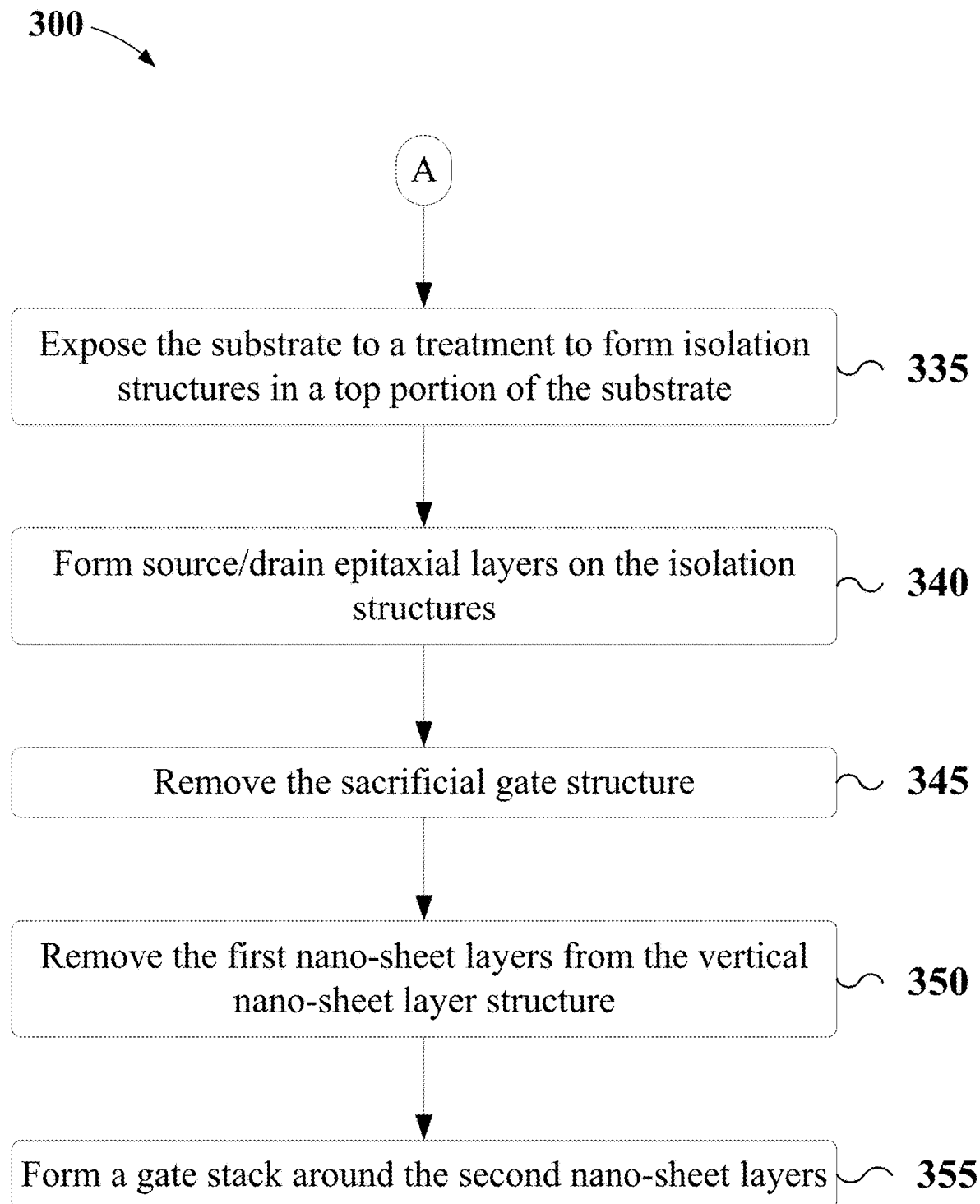

According to some embodiments, FIGS. 3A and 3B show flow charts of a fabrication method 300 that describes the formation of GAA FET 100 shown in FIG. 1. Method 300 is independent of the substrate used—for example, method 300 can also be used to form GAA FET 100 shown in FIG. 2. Further, method 300 can be used to produce variations of GAA FET 100 as shown in FIG. 21. Other fabrication operations can be performed between the various operations of method 300 and are omitted merely for clarity. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than the ones shown in FIGS. 3A and 3B. In some embodiments, one or more other operations may be performed in addition to or in place of the presently described operations. For illustrative purposes, method 300 is described with reference to the embodiments shown in FIGS. 4 through 21.

Figure 4:
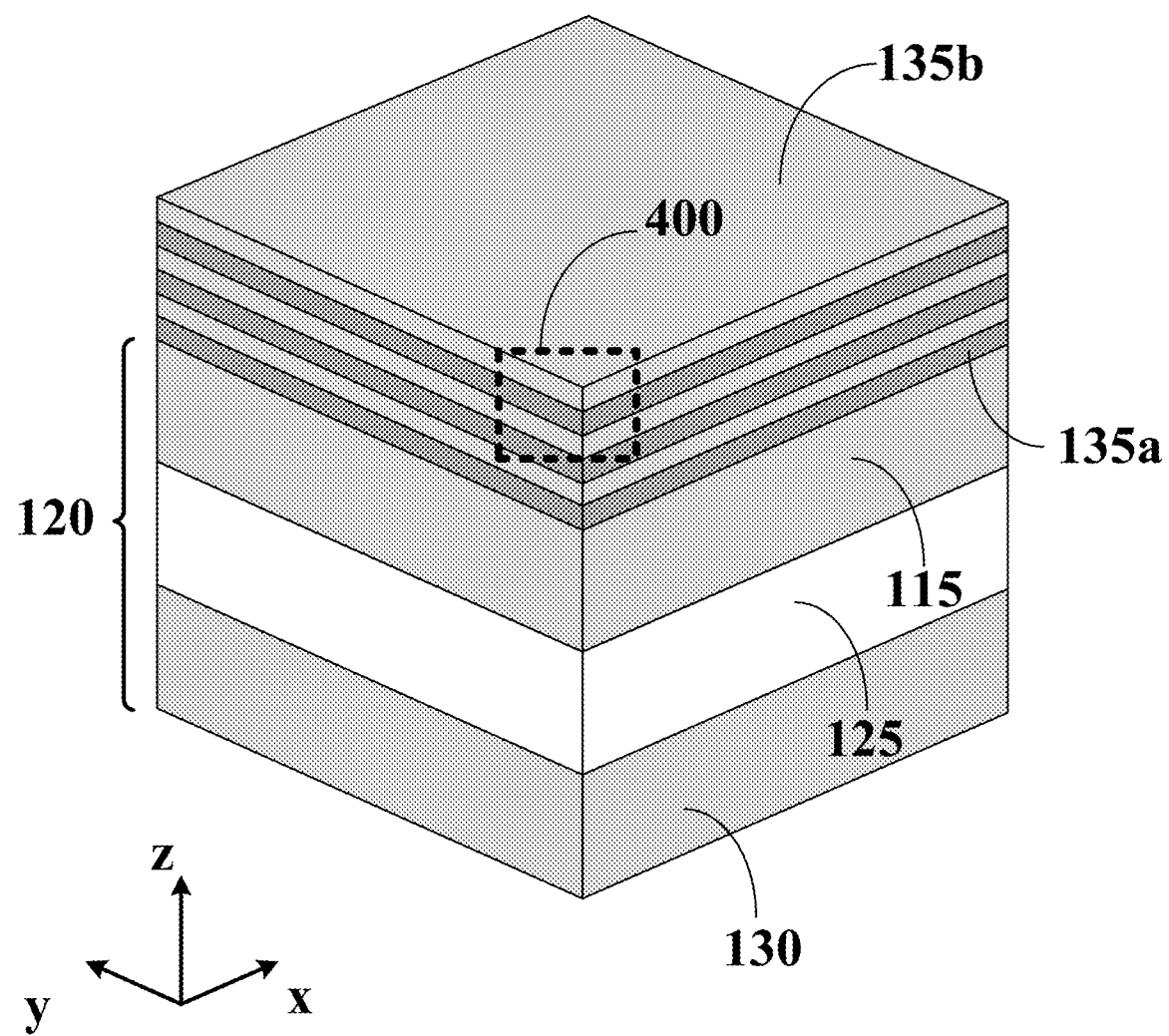
FIGS. 4-10 are isometric views of intermediate structures during the fabrication of a gate-all-around nano-sheet FET structure, in accordance with some embodiments.
Figure 5:
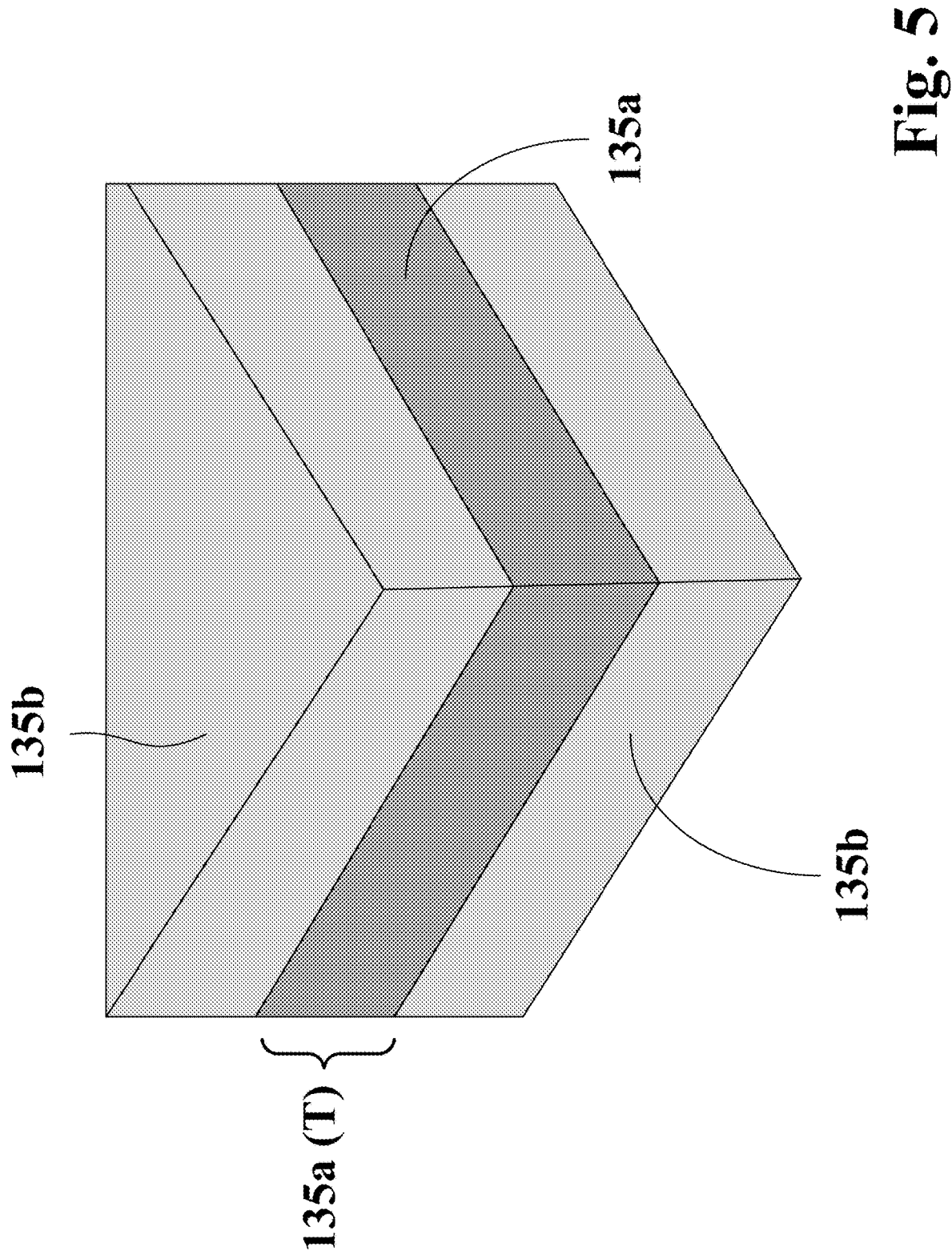
Figure 6:
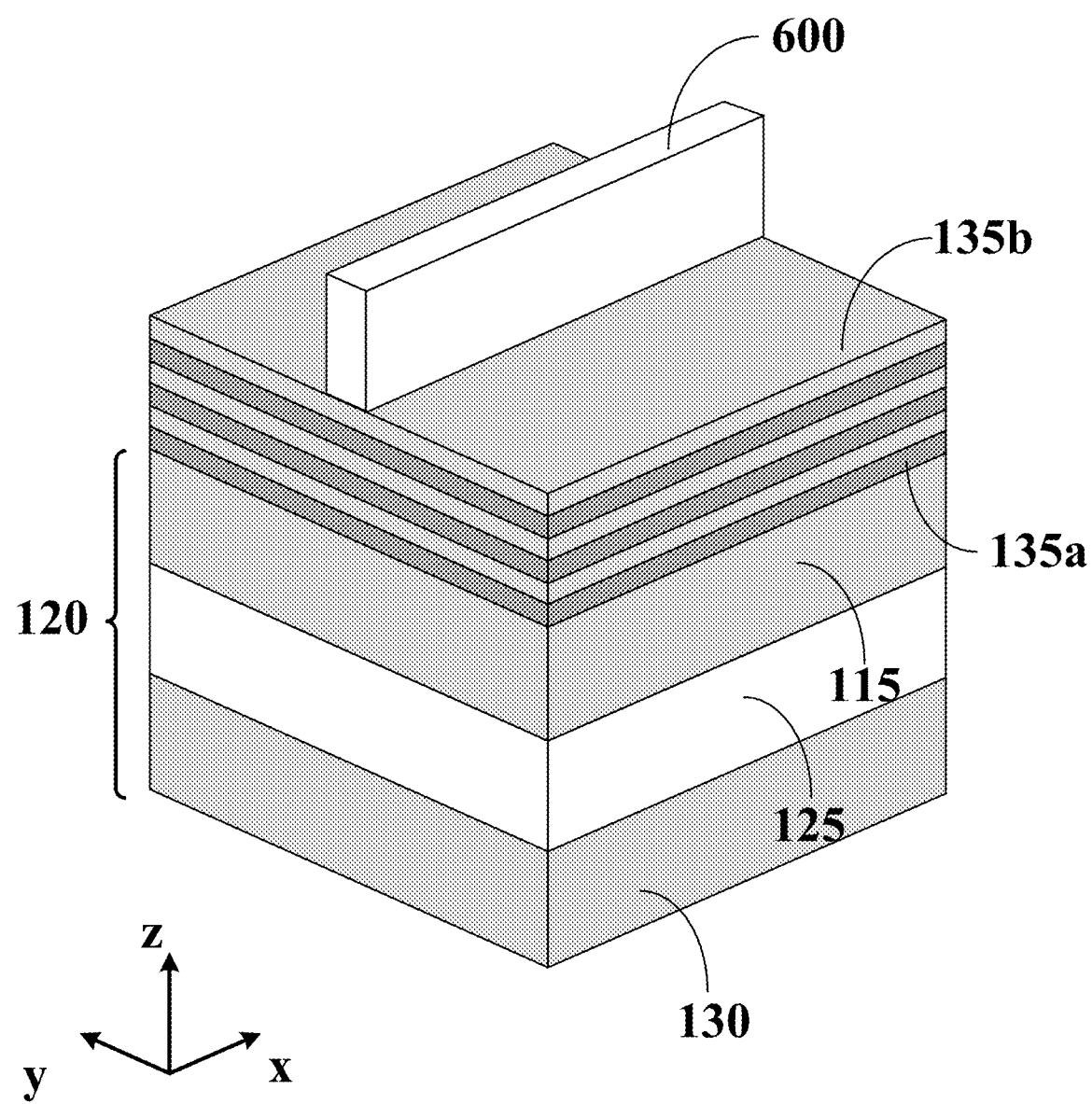

Method 300 begins with operation 305 and the process of forming alternating first and second nano-sheet layers on a substrate. FIG. 4 is a partial isometric view of first nano-sheet layers 135a and second nano-sheet layers 135b formed on substrate 120 according to operation 305. In some embodiments, first nano-sheet layers 135a correspond to SiGe nano-sheet layers (SiGe nano-sheet layers 135a), and second nano-sheet layers 135b correspond to Si nano-sheet layers (Si nano-sheet layers 135b).

In some embodiments, SiGe nano-sheet layers 135a and Si nano-sheet layers 135b can be grown directly on substrate 120 (e.g., an SOI substrate or a bulk substrate) with a chemical vapor deposition (CVD) process using silane ($SiH_4$), disilane ($Si_2H_6$), germane ($GeH_4$), digermane ($Ge_2H_6$), dichlorosilane ($SiH_2Cl_2$), other suitable gases, or combinations thereof. As discussed above, SiGe nano-sheet layers 135a can contain between about 20% and about 30% Ge while Si nano-sheet layers 135b are substantially germanium-free—e.g., have a Ge concentration between about 0.1% and about 1%. In some embodiments, SiGe nano-sheet layers 135a and/or Si nano-sheet layers 135b can be doped.

In some embodiments, the thickness of SiGe nano-sheet layers 135a sets the spacing between every other Si nano-sheet layer 135b, and similarly the thickness of Si nano-sheet layers 135b sets the spacing between every other SiGe nano-sheet layer 135a in the stack formed by SiGe nano-sheet layers 135a and Si nano-sheet layers 135b. For example, in referring to FIG. 5, which is a magnified view of section 400 shown in FIG. 4, thickness 135a (T) of SiGe nano-sheet layer 135a can be used to define the spacing of Si nano-sheet layers 135b. Here, the spacing between the nano-sheet layers can be defined. As discussed above, the thickness of each nano-sheet layer can range, for example, from about 5 nm to about 8 nm. Since the SiGe and Si nano-sheet layers are grown individually, the SiGe nano-sheet layers 135a and the Si nano-sheet layers 135b can have a similar or different thickness from one another. Further, each of the SiGe nano-sheet layers can have a similar or different thickness from one another, and similarly each of the Si nano-sheet layers can have a similar or different thickness from one another. The aforementioned thickness permutations are within the spirit and the scope of this disclosure.

In referring to FIG. 3A, method 300 continues with operation 310 and the process of patterning the first and second nano-sheet layers to form a vertical nano-sheet layer structure. In some embodiments, formation of the vertical nano-sheet layer structure can be formed as follows. In referring to FIGS. 6 and 7A, a photoresist layer is spin-coated over the uppermost Si nano-sheet layer 135b and subsequently patterned to form patterned photoresist structure 600. Patterned photoresist structure 600 functions as an etch mask in a subsequent etching process during which portions of Si nano-sheet layers 135b and SiGe nano-sheet layers 135a not covered by patterned photoresist structure 600 (e.g., not masked) are removed to form a vertical nano-sheet layer structure 700 shown in FIG. 7A. After the formation of vertical nano-sheet layer structure 700, patterned photoresist structure 600 can be removed from vertical nano-sheet layer structure 700 with a wet cleaning process. In some embodiments, during the aforementioned patterning process, semiconductor layer 115 of substrate 120 is also patterned to form pedestal structure 115p. Pedestal structure 115p facilitates the formation of a shallow trench isolation (STI) structure 710 shown in FIG. 7B.

In some embodiments, width 600w of patterned photoresist structure 600 defines the width of vertical nano-sheet layer structure 700 along the y-dimension, which subsequently defines the width of the channel region in GAA FET 100. According to some embodiments, the current density through the channel region is based on the width of the channel region in GAA FET 100. For example, a wide channel region can carry a higher current density than a narrow channel region. In some embodiments, a narrow channel region may provide better gate control than a wide channel region. Therefore, the width of nano-sheet layers can be adjusted to offer a balance between current density and gate control over the channel region. Further, by controlling width 600w of pattern photoresist structure 600, vertical nano-sheet layer structure 700 with different widths can be formed on substrate 120. For example, GAA FETs can be built with different nano-sheet layer widths at any desired location on substrate 120.

Figure 7A:
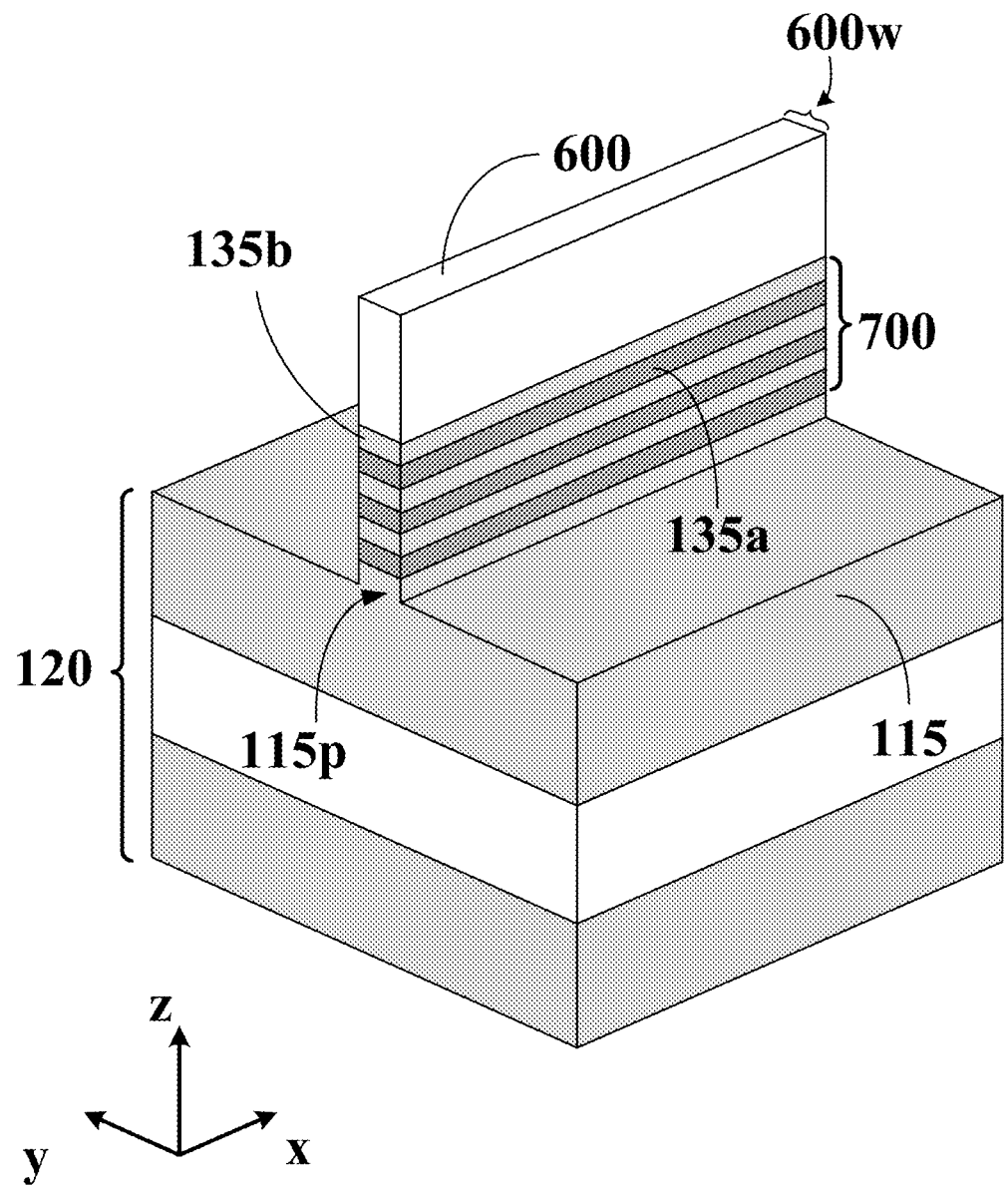
Figure 7B:
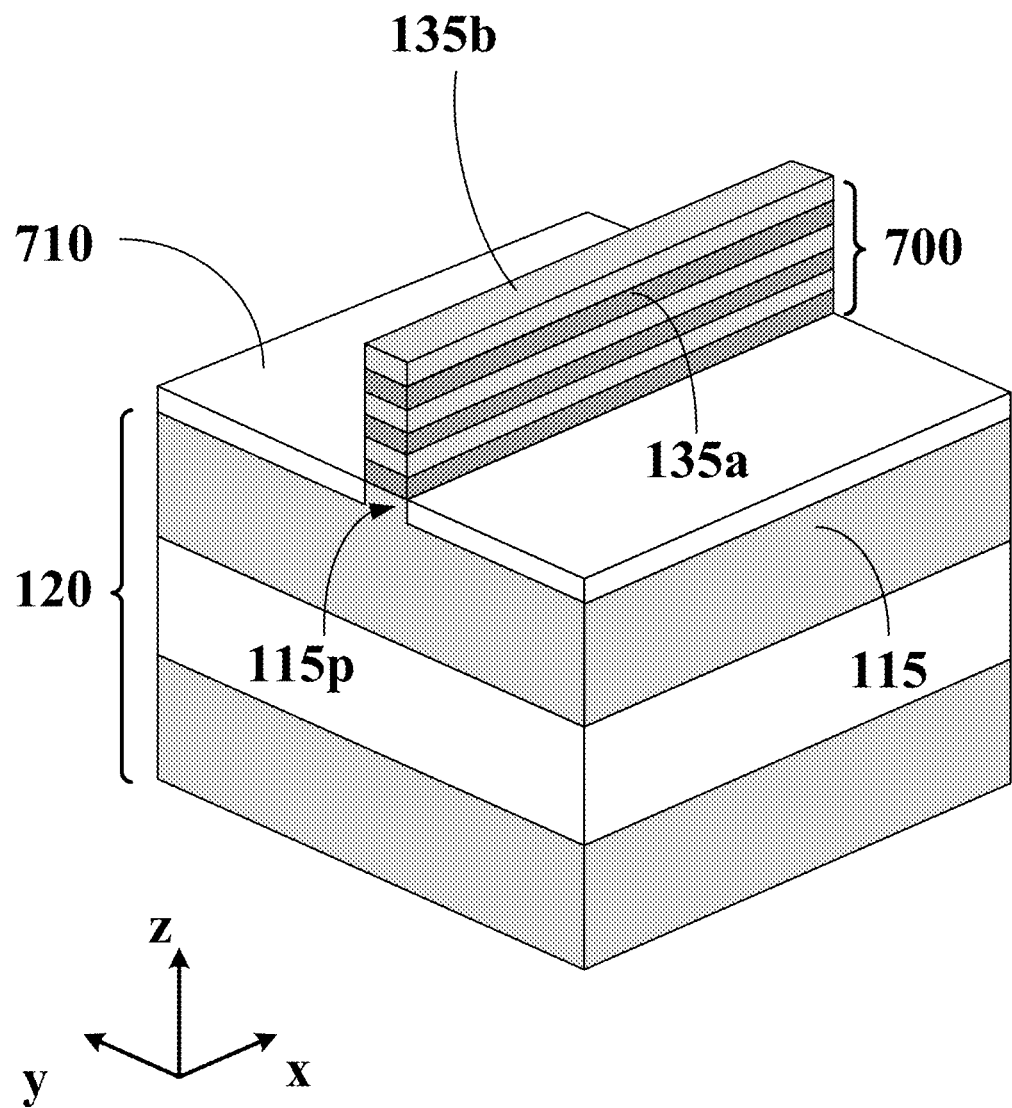

After the removal of patterned photoresist structure 600 from vertical nano-sheet layer structure 700, STI structure 710 is formed on the patterned top surface of semiconductor layer 115. In some embodiments, to form STI structure 710, STI material (e.g., a silicon oxide based dielectric) is blanket deposited over vertical nano-sheet layer structure 700 and semiconductor layer 115. The as-deposited STI material can be subsequently planarized (e.g., with a chemical mechanical polishing (CMP) process) so that the top surface of the STI material is coplanar with the top surface of vertical nano-sheet layer structure 700. The planarized STI material is then etched-back so that the resulting STI structure 710 has a height substantially equal to pedestal structure 115p, as shown in FIG. 7B. In some embodiments, intentional to facilitate the subsequent processing operations, vertical nano-sheet layer structure 700 protrudes from STI structure 710 so that STI structure 710 does not cover any sidewall portion of vertical nano-sheet layer structure 700 as shown in FIG. 7B.

Figure 8:
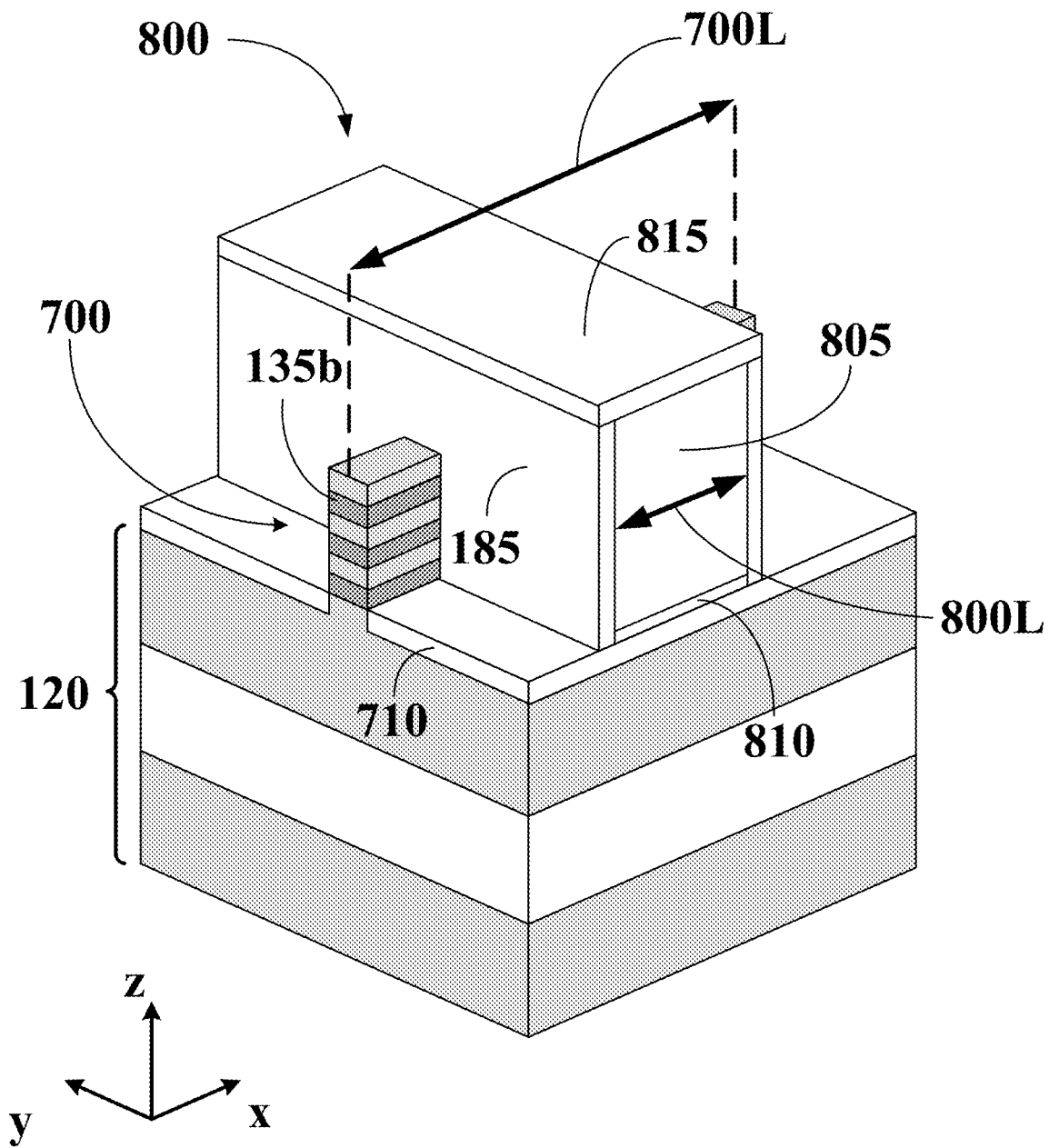

In referring to FIGS. 3A and 8, method 300 continues with operation 315 and the process of forming a sacrificial gate structure 800 on vertical nano-sheet layer structure 700. In some embodiments, sacrificial gate structure 800 includes polysilicon gate electrode 805 and gate oxide 810. In some embodiments, polysilicon gate electrode 805 and gate oxide 810 can be blanket deposited to cover side and top surface portions of vertical nano-sheet layer structure 700 and the top surface of STI structure 710. The blanket deposited polysilicon gate electrode 805 and gate oxide 810 are subsequently patterned to form sacrificial gate structure 800 shown in FIG. 8. In some embodiments, gate oxide 810 includes, for example, silicon oxide or silicon-oxynitride silicon oxide (SiON) and is interposed between polysilicon gate electrode 805 and vertical nano-sheet layer structure 700. For example, gate oxide 810 is formed prior to polysilicon gate electrode 805. In some embodiments, sacrificial gate structure 800 is formed perpendicular to a length (e.g., the longest dimension) of vertical nano-sheet layer structure 700—for example, along the y-dimension and perpendicular to the x-direction). Further, sacrificial gate structure 800 does not cover the entire length of vertical nano-sheet layer structure 700. In some embodiments, as shown in FIG. 8 and to facilitate subsequent operations, edge portions of vertical nano-sheet layer structure 700 are not covered (e.g., not masked) by sacrificial gate structure 800. In other words, width 700L is larger than width 800L—for example, 700L>800L.

Sidewalls of sacrificial gate structure 800 are covered by gate spacers 185, which are also shown in FIGS. 1 and 2. In some embodiments, gate spacers 185 are not removed by a replacement gate process during which sacrificial gate structure 800 is replaced by gate stack 145. In some embodiments, a top surface of polysilicon gate electrode 805 is covered with a gate capping or protective layer 815. In some embodiments, gate capping layer 815 can be a stack of layers. For example, gate capping layer 815 may include an oxide layer (e.g., silicon oxide) and a nitride layer (e.g., SiN, SiON, SiOCN, etc.) not shown in FIG. 8. In some embodiments, gate capping layer 815 and gate spacers 185 protect sacrificial gate structure from subsequent processing.

Figure 9:
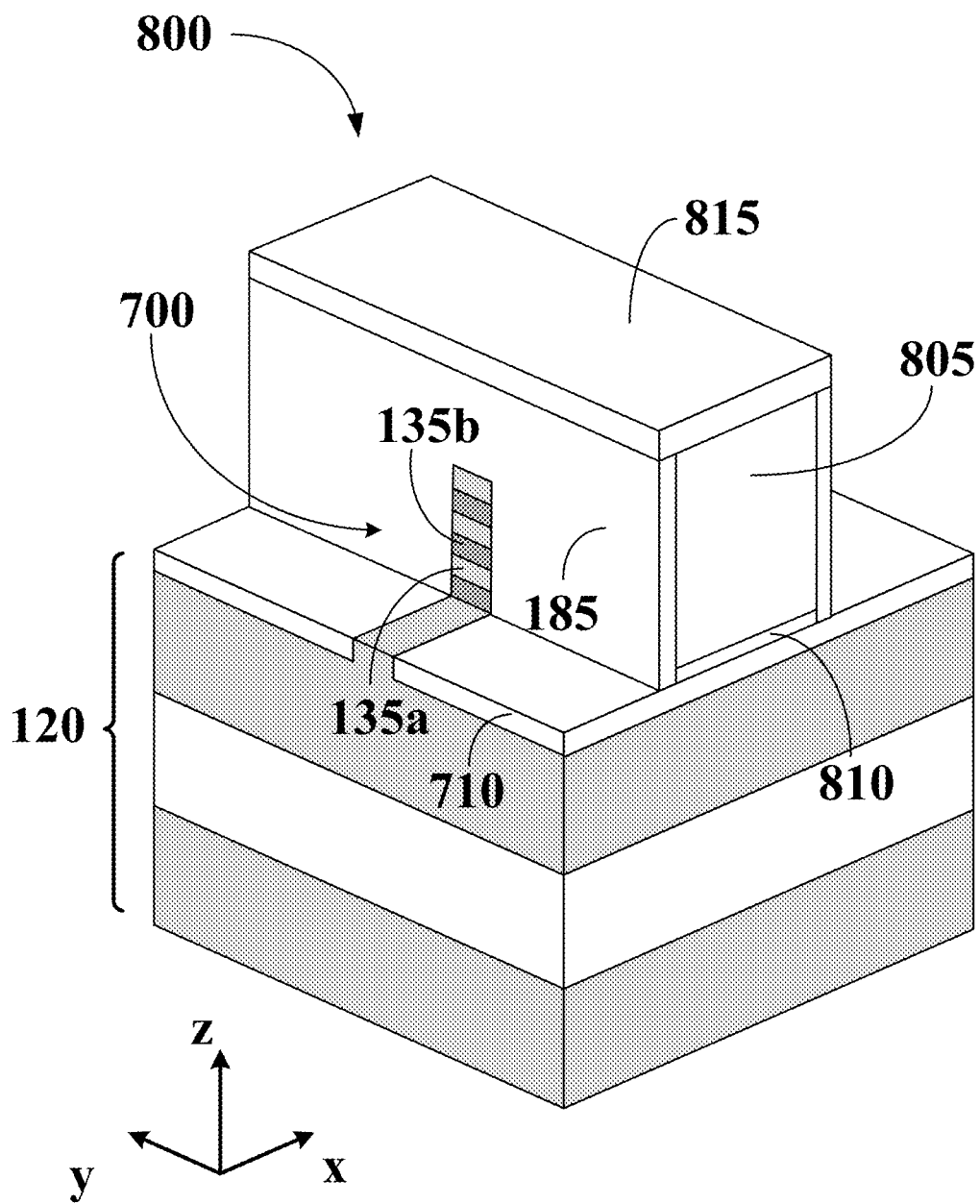

In referring to FIG. 3A, method 300 continues with operation 320 and the process of removing (e.g., trimming) portions vertical nano-sheet layer structure 700 not covered by sacrificial gate structure 800 as shown in FIG. 9. In some embodiments, the removal process involves a dry etching process, a wet etching process, or a combination thereof selective towards Si nano-sheet layers 135b and SiGe nano-sheet layers 135a. In some embodiments, the dry etching process can include etchants having an oxygen-containing gas, a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)), a chlorine-containing gas (e.g., chlorine ($Cl_2$), chloroform ($CHCl_3$), carbon tetrachloride ($CCl_4$), and/or boron trichloride ($BCl_3$)), a bromine-containing gas (e.g., hydrogen bromide (HBr) and/or bromoform ($CHBr_3$)), an iodine-containing gas, other suitable etching gases and/or plasmas, or combinations thereof. The wet etching process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof. In some embodiments, the etching chemistry does not substantially etch STI structure 510, gate capping layer 815, and gate spacers 185. In some embodiments, STI structure 510 is used as an etch stop layer for the etching process described above.

Figure 10:
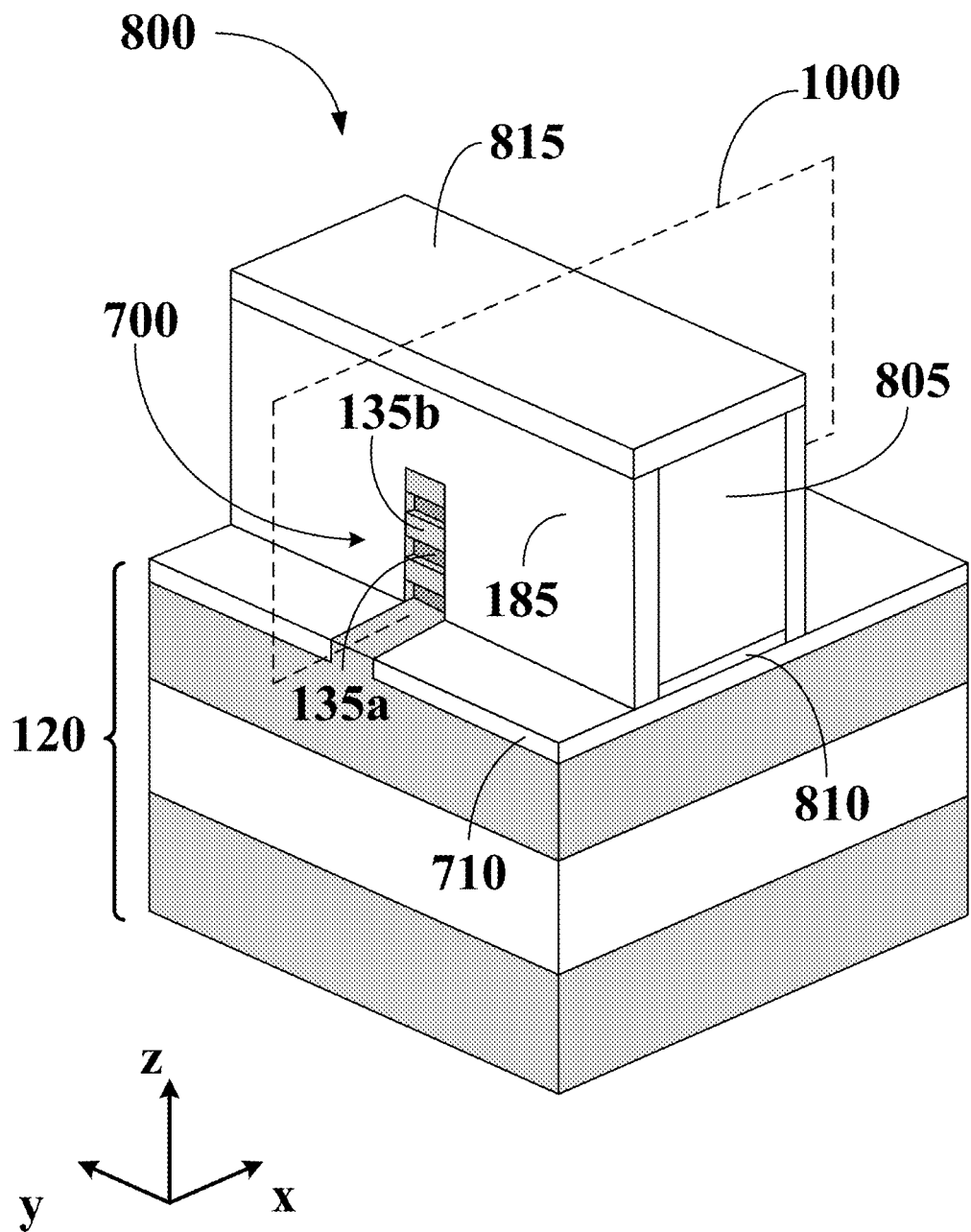

In referring to FIG. 3A, method 300 continues with operation 325 and the process of partially etching the first nano-sheet layers (e.g., SiGe nano-sheet layers 135a) from vertical nano-sheet layer structure 700. According to some embodiments, FIG. 10 shows the structure of FIG. 9 after operation 325 where exposed edges of SiGe nano-sheet layers 135a have been laterally recessed along the x-direction. In some embodiments, FIG. 11 is a cross-sectional view of the structure shown in FIG. 10 along plane 1000.

Figure 11:
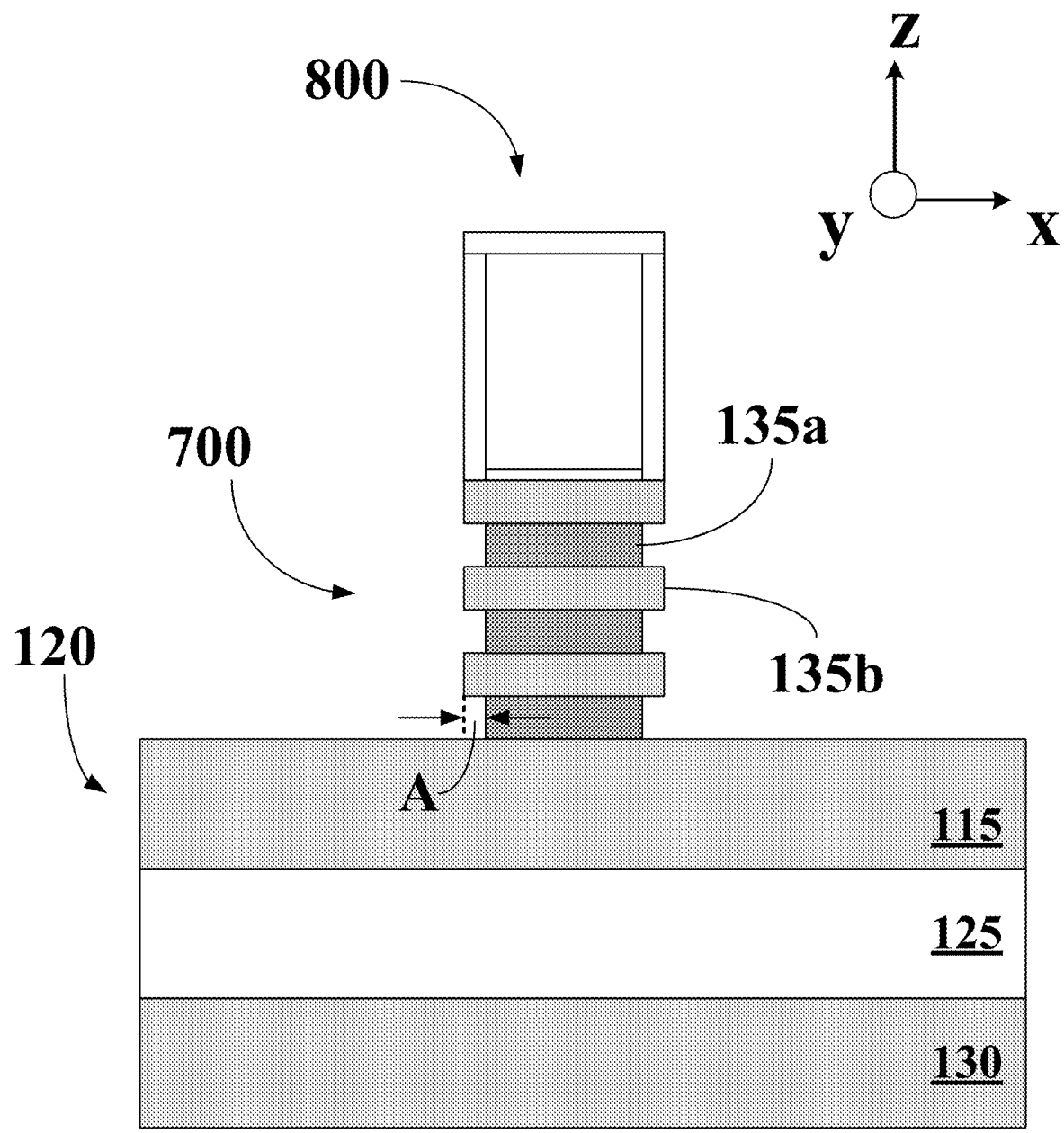

According to some embodiments, exposed edges of SiGe nano-sheet layers 135a are recessed (e.g., partially etched) by an amount A that ranges between about 5 nm and about 10 nm along the x-direction as shown in FIG. 11. In some embodiments, spacer structures 140 shown in FIG. 1 will be formed on the recessed portions of SiGe nano-sheet layers 135a. According to some embodiments, recessed amounts less than about 5 nm result in spacer structure 140 that is too thin to provide adequate electrical isolation between gate structure 145 and S/D epitaxial layers 110. On the other hand, a recess amount greater than about 10 nm results in spacer structure 140 that is unnecessarily thick, consumes valuable space from gate stack 145, and reduces the gate length of the resulting device.

In some embodiments, the recess in SiGe nano-sheet layers 135a can be achieved with a dry etching process that is selective towards SiGe. For example, halogen-based chemistries exhibit high etch selectivity towards Ge and low towards Si. Therefore, halogen gases etch Ge-containing layers (e.g., SiGe nano-sheet layers 135a) at a higher etching rate than substantially Ge-free layers (e.g., Si nano-sheet layers 135b). In some embodiments, the halogen-based chemistries include fluorine-based and/or chlorine-based gasses. Alternatively, a wet etching chemistry with high selectivity towards SiGe can be used. In some embodiments, a wet etching chemistry may include a mixture of sulfuric acid ($H_2SO_4$) and hydrogen peroxide ($H_2O_2$) (SPM), or a mixture of ammonia hydroxide with $H_2O_2$ and water (APM). The aforementioned etching processes are timed so that the desired amount of SiGe is removed.

In some embodiments, SiGe nano-sheet layers 135a with a higher Ge atomic concentration have a higher etching rate than SiGe nano-sheet layers 135a with a lower Ge atomic concentration. Therefore, the etching rate of the aforementioned etching processes can be adjusted by modulating the Ge atomic concentration (e.g., the Ge content) in SiGe nano-sheet layers 135a. As discussed above, the Ge content in SiGe nano-sheet layers 135a can range between about 20% and about 30%. A SiGe nano-sheet layer with about 20% Ge can be etched slower than a SiGe nano-sheet layer with about 30% Ge. Consequently, the Ge concentration can be adjusted accordingly to achieve the desired etching rate and selectivity between SiGe nano-sheet layers 135a and Si nano-sheet layers 135b.

In some embodiments, a Ge concentration below about 20% does not provide adequate selectivity between SiGe nano-sheet layers 135a and Si nano-sheet layers 135b. For example, the etching rate between SiGe nano-sheet layers 135a and Si nano-sheet layers 135b becomes substantially similar to one another and both types of nano-sheet layers are etched during the etching process. On the other hand, for Ge concentrations higher than about 30%, Ge atoms can out-diffuse from SiGe nano-sheet layers 135a towards Si nano-sheet layers 135b (e.g., during growth) and change the selectivity between SiGe nano-sheet layers 135a and Si nano-sheet layers 135b during etching. Since Ge out-diffusion cannot be controlled, Ge concentrations higher than about 30% can result in unpredictable etching amounts.

Figure 12:
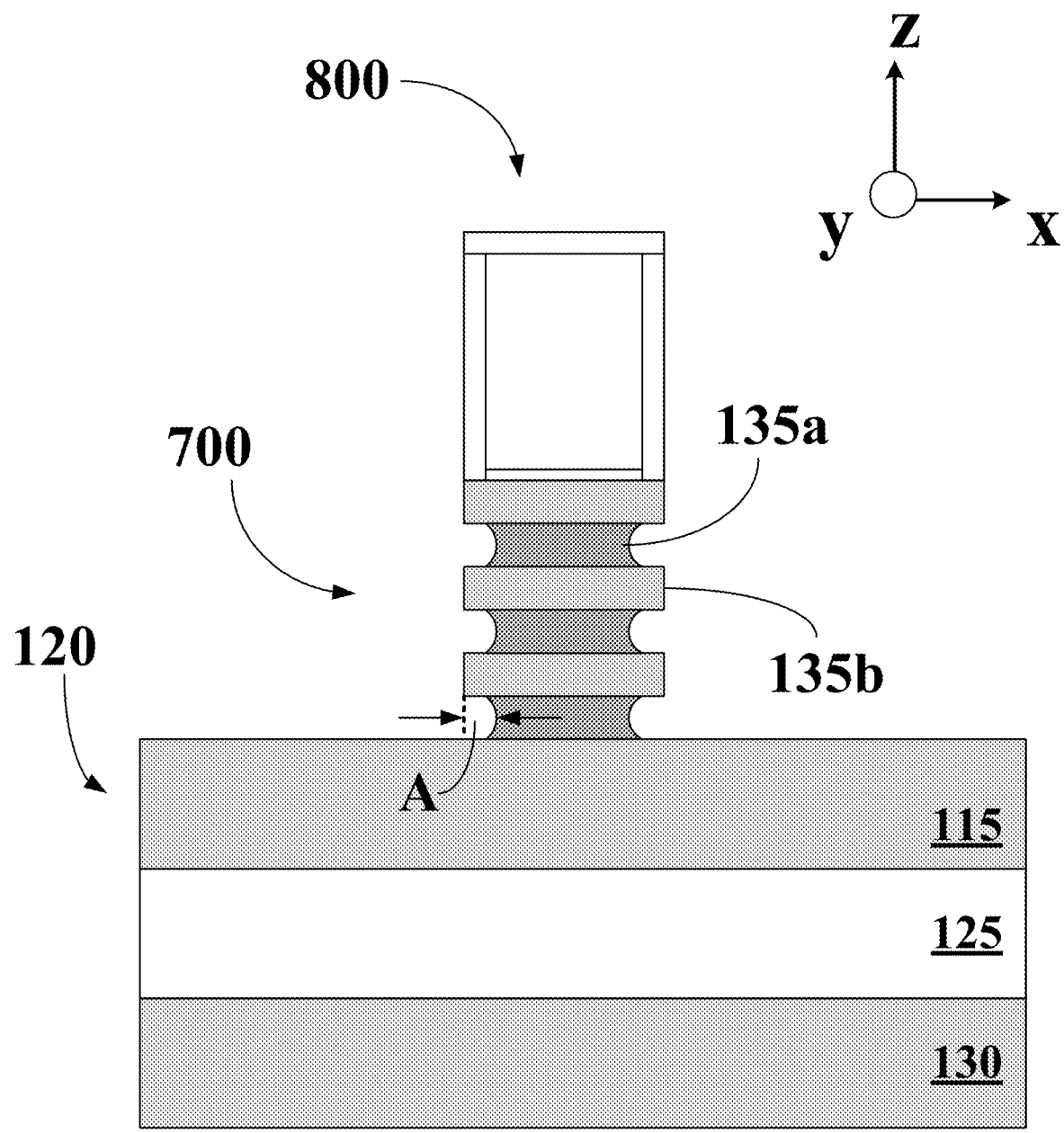

In some embodiments, the etched edges of SiGe nano-sheet layers 135a after operation 325 are not vertical as shown in FIG. 11 but concave as shown in FIG. 12. In the case of concave edges, recess amount A is measured, for example, from the apex of the concave edges of SiGe nano-sheet layer 135a to the adjacent vertical edges of Si nano-sheet layer 135b, as shown in FIG. 12. In some embodiments, recessed amount A in FIG. 12 is between about 5 nm and about 10 nm—e.g., similar to recess amount A shown in FIG. 11.

Figure 13:
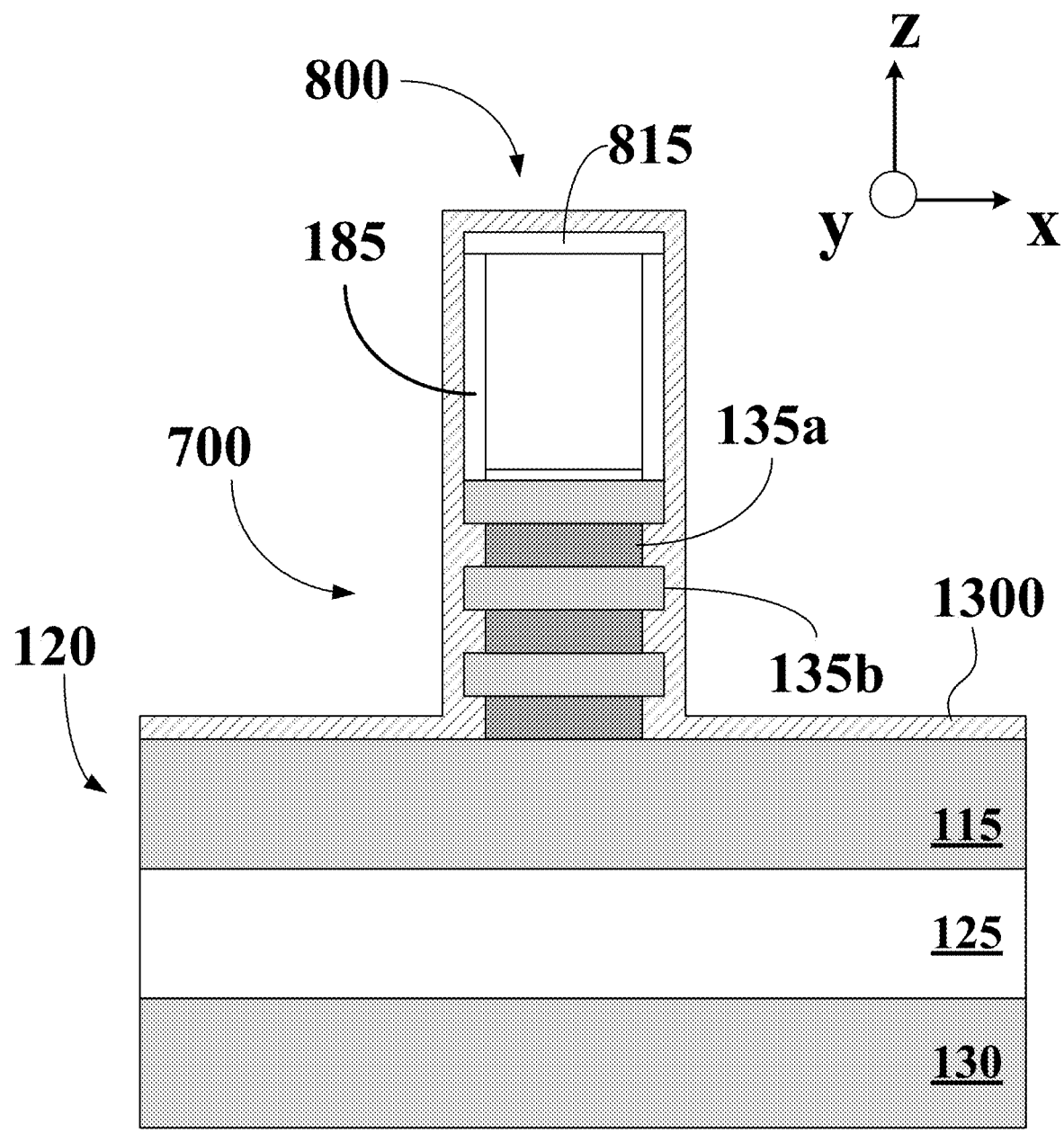

In referring to FIG. 3A, method 300 continues with operation 330 and the process of depositing a capping layer on vertical nano-sheet layer structure 700. In some embodiments, the capping layer is blanket deposited over the entire structure shown in FIG. 11. For example, in referring to FIG. 13, capping layer 1300 of operation 330 is deposited on the exposed surfaces of substrate 120, vertical nano-sheet layer structure 700, gate spacers 185, and gate capping layer 815. In some embodiments, capping layer 1300 is deposited at a thickness between about 5 nm and about 10 nm to sufficiently fill recess amount A shown in FIGS. 11 and 12. In some embodiments, capping layer 1300 includes a silicon-based dielectric, such as SiN, SiOCN, SiCN, or SiON. In some embodiments, capping layer 1300 can be deposited with a plasma-enhance atomic layer deposition (PEALD) process or another suitable method capable of depositing conformal layers. As shown in FIG. 13, capping layer 1300 fills the space formed by the recessed edge portions of SiGe nano-sheet layers 135a. As a result of the capping layer deposition, sidewall surfaces of vertical nano-sheet layer structure 700 are no longer exposed.

In referring to FIG. 3B, method 300 continues with operation 335 and the process of exposing substrate 120 to a treatment to form isolation structures 105 (e.g., shown in FIGS. 1 and 2) in a top portion of substrate 120 (e.g., in semiconductor layer 115). In some embodiments, the plasma treatment includes a directional decoupled plasma oxidation (DDPO) process using a gas mixture of oxygen and helium in a ratio between about 10/100 and about 50/100. In some embodiments, the DDPO process includes an RF plasma power between about 1 kW and about 2 kW and an RF bias applied to substrate 120 between about 10 W and about 150 W. In some embodiments, the process pressure and temperature during the DDPO process is respectively between about 10 mTorr and about 30 mTorr and between about 250° C. and about 450° C. In some embodiments, an RF plasma power below about 1 kW produces a lower density plasma that requires longer processing times. The aforementioned process ranges are exemplary and not limiting. Therefore, other suitable ranges may be used. These other ranges are within the spirit and the scope of this disclosure.

A characteristic feature of the DDPO process discussed above is its directionality. In some embodiments, the substrate bias, the plasma density, the temperature, and the process pressure are tuned so that oxidation occurs preferentially along the vertical axis (e.g., along the z-axis) to achieve the desired vertical thickness for isolation structures 105. For example, as discussed above with reference to FIGS. 1 and 2, the resulting isolation structures 105 have a vertical thickness greater than about 10 nm and equal to or less than about the thickness of semiconductor layer 115 shown in FIG. 1 (e.g., between about 20 nm and about 200 nm). For example, isolation structures 105 can have a vertical thickness between about 10 nm and about 80 nm. In some embodiments, and in referring to FIG. 14, an edge portion of isolation structures 105 may extent laterally (e.g., along the x-direction) under vertical nano-sheet gate structure 700 by an amount between about 1 nm and about 3 nm as indicated by dashed circle B. This is because oxidation can occur at a slower rate along the x- and y-directions.

In some embodiments, isolation structures formed below source terminals can have a different thickness than isolation structures formed below drain terminals. For example, if the voltage applied to the drain epitaxial layers (e.g., during operation) is higher than that of the source epitaxial layers, the isolation structure below the drain epitaxial layers can be formed thicker than the isolation structure below the source epitaxial layer. This can be achieved, for example, by masking the terminal receiving the lowest voltage during a portion of the DDPO process so that the isolation structure can be formed thinner.

Figure 14:
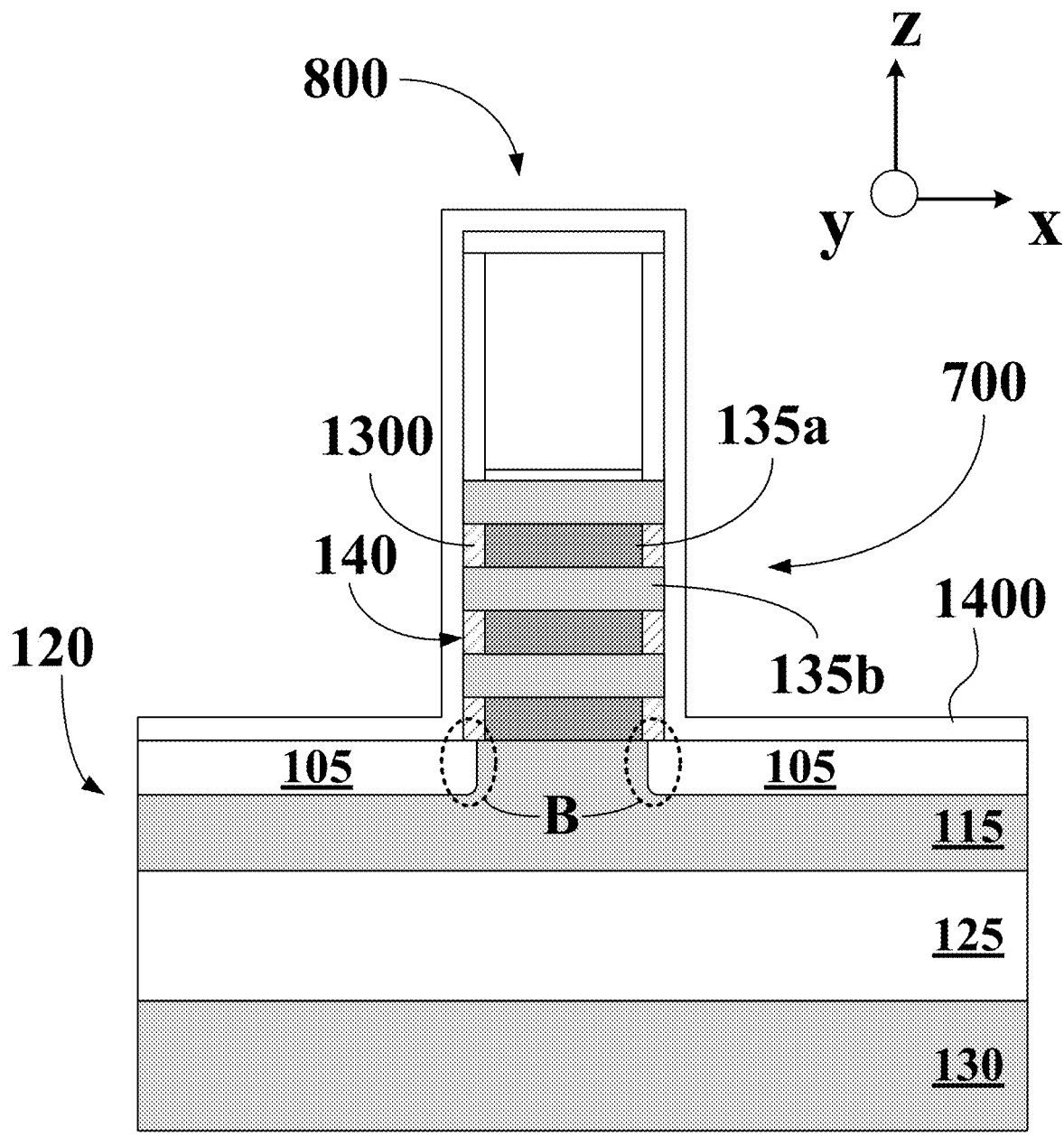

In some embodiments, during operation 335, a portion of capping layer 1300 is oxidized and converted to an oxide 1400 shown in FIG. 14. The oxidation of capping layer 1300 occurs from its top surface and inwards. Due to the directionality of the DDPO process, oxidation of capping layer 1300 is accelerated along the vertical direction z. In some embodiments, the DDPO process is timed so that the entire capping layer 1300 is oxidized besides the portions of capping layer 1300 adjacent to recessed edges of SiGe nano-sheet layer 135a within vertical nano-sheet layer structure 700 as shown in FIG. 14. Hence, the un-oxidized portions of capping layer 1300 form spacer structures 140 shown in FIGS. 1, 2, and 14.

Figure 15:
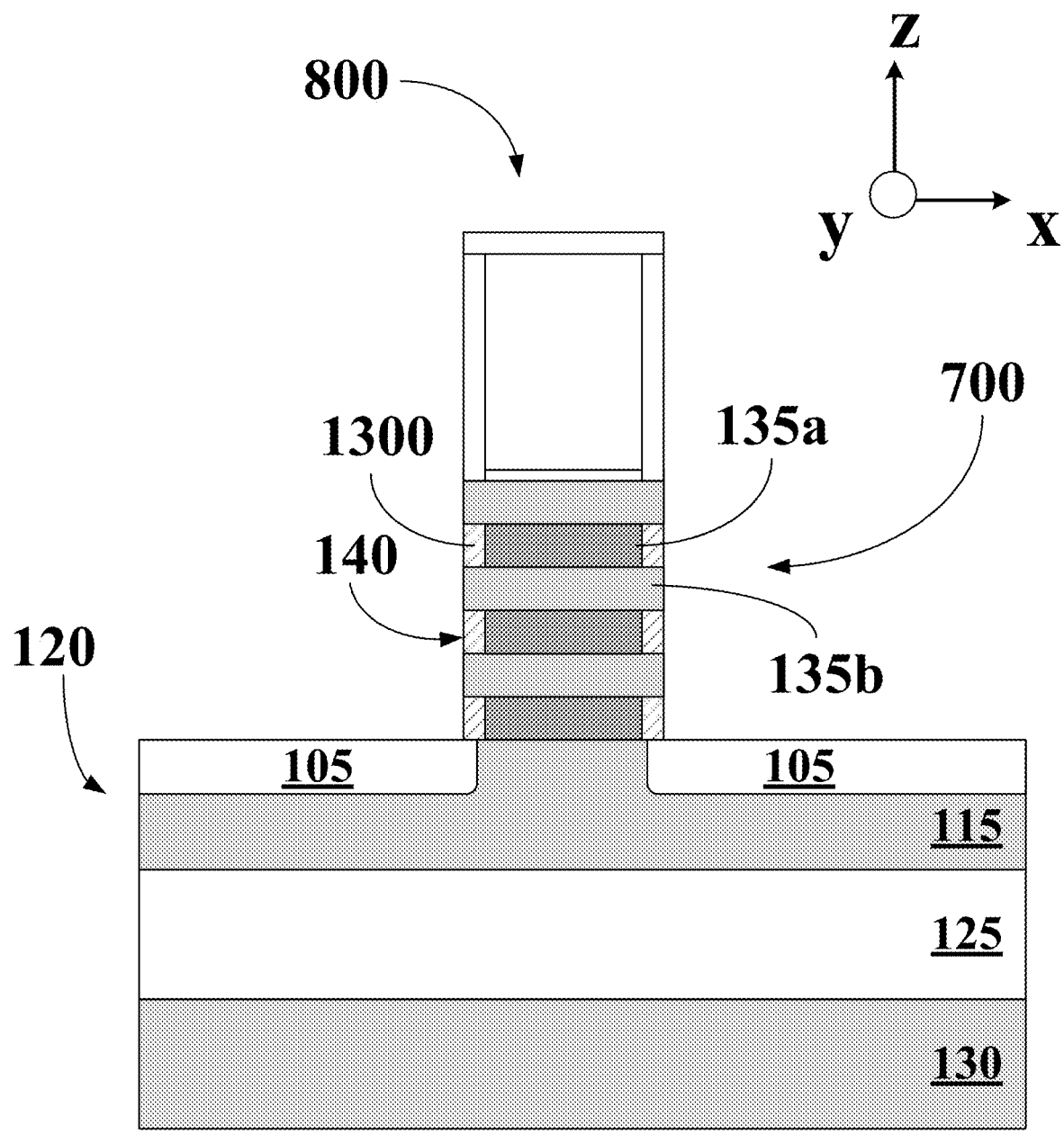
Figure 17:
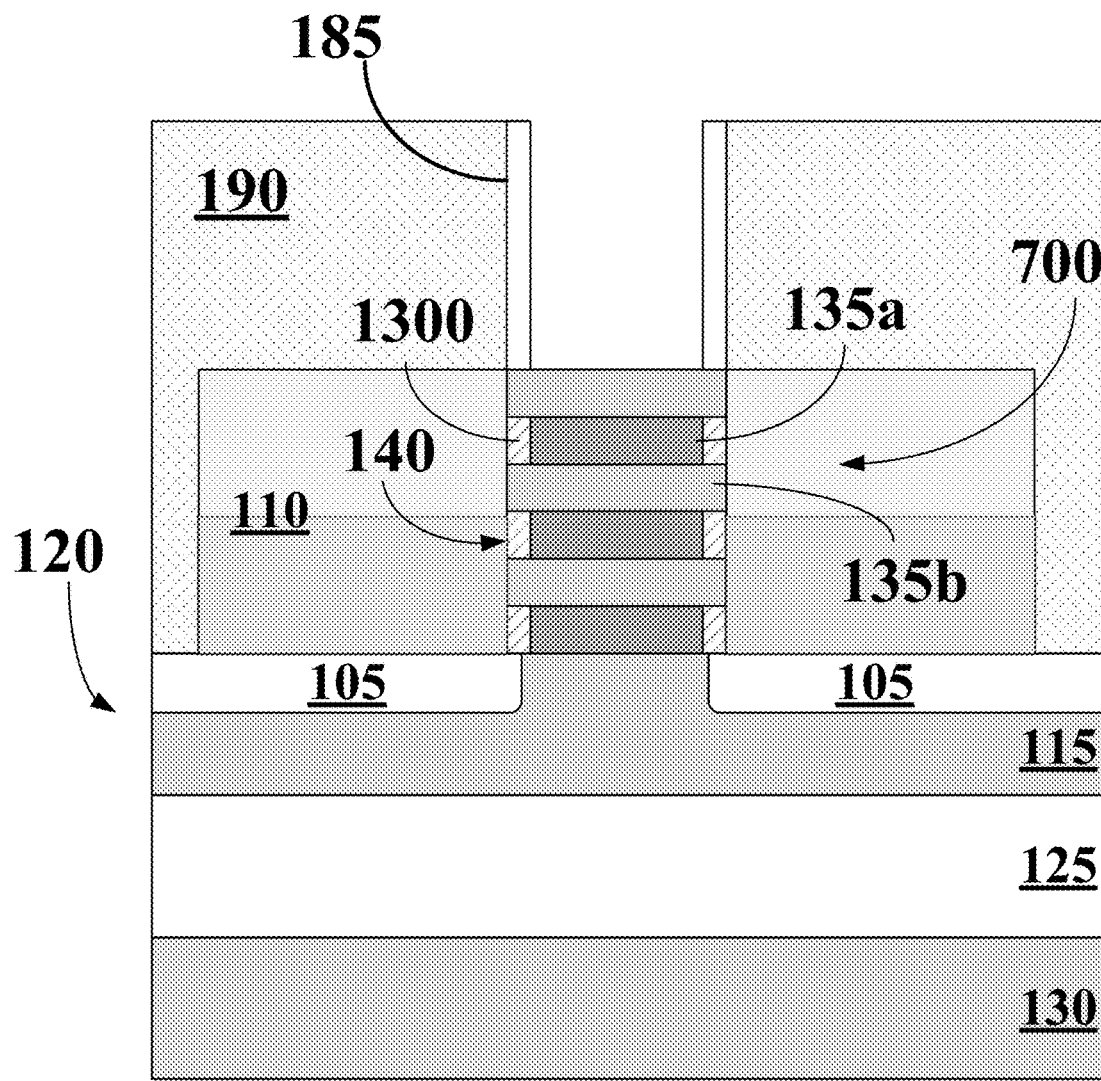

In a subsequent operation, oxide 1400 (e.g., the oxidized portions of capping layer 1300) is removed as shown in FIG. 15. In some embodiments, oxide 1400 can be removed with a dry etching process that includes ammonia ($NH_3$) and nitrogen trifluoride ($NF_3$) plasma (e.g., a SICONI process) selective to oxide 1400 (e.g., silicon oxide). In some embodiments, if the deposited thickness of capping layer 1300 is less than about 5 nm, the entire capping layer 1300 can be oxidized during the DDPO process, including the portions of capping layer 1300 adjacent to recessed edges of SiGe nano-sheet layer 135*a*. Therefore, oxide 1400 would include the entire capping layer 1300. As a result, during the removal operation described above, the entire oxidized capping layer would be removed and no spacer structures would be formed. On the other hand, if the thickness of capping layer 1300 is greater than about 10 nm, desired portions of capping layer 1300 may not be oxidized during the DDPO process because capping layer 1300 would be too thick. These desired portions include sidewall portions of capping layer 1300 except the portions of capping layer 1300 adjacent to recessed edges of SiGe nano-sheet layer 135*a*. Since only oxidized portions are removed, any non-oxidized portion of capping layer 1300 would not be removed, including non-oxidized portions of the capping layer's sidewalls. Therefore, the formed spacer structures 140 would cover side surfaces of the entire vertical nano-sheet layer structure 700, including side surfaces of Si nano-sheet layer 135*b*, which is undesirable.

Referring to FIGS. 3B and 16, method 300 continues with operation 340 and the process of forming S/D epitaxial layers 110 on isolation structures 105. In some embodiments, S/D epitaxial layers 110 are grown with a CVD process similar to the one used to form SiGe nano-sheet layers 135*a* and the Si nano-sheet layers 135*b*. For example, p-doped Si S/D epitaxial layers 110 (e.g., appropriate for n-type GAA FETs) can be grown using a silane ($SiH_4$) precursor. A phosphorous (P) dopant can be introduced during growth. In some embodiments, the phosphorous concentration can range from about $1\times10^{21}$ atoms/$cm^3$ to about $8\times10^{21}$ atoms/$cm^3$. The aforementioned doping concentration ranges are not limiting and other doping concentration ranges are within the spirit and the scope of this disclosure.

Accordingly, a B-doped SiGe S/D epitaxial layers 110 (e.g., appropriate for p-type GAA FETs) can include two or more epitaxial layers (not shown in FIG. 16) grown in succession and featuring different Ge atomic percentages and B concentrations. For example, a first layer can have a Ge atomic % that ranges from 0 to about 40%, and a B dopant concentration that ranges from about $5\times10^{19}$ atoms/$cm^3$ to about $1\times10^{21}$ atoms/$cm^3$. A second epitaxial layer can have a Ge atomic % that ranges from about 20% to about 80%, and a B dopant concentration that ranges from about $3\times10^{20}$ atoms/$cm^3$ to about $5\times10^{21}$ atoms/$cm^3$. Further, a third epitaxial layer can be a capping layer that has similar Ge atomic % and B dopant concentrations as the first layer (e.g., 0 to about 40% for Ge, and about $5\times10^{19}$ atoms/$cm^3$ to about $1\times10^{21}$ atoms/$cm^3$ for B dopant). The aforementioned doping concentrations are not limiting and other doping concentrations are within the spirit and the scope of this disclosure.

In some embodiments, after the formation of S/D epitaxial layers 110, ILD 190 is deposited and subsequently planarized (e.g., with a CMP process) so that a top surface of ILD 190 is substantially co-planar with a top surface of polysilicon gate electrode 805. During the aforementioned planarization process, gate capping layer 815, which functions as a planarization etch stop layer, is removed from the top surface of polysilicon gate electrode 805. Therefore, after operation 340, the top surface of polysilicon gate electrode 805 is exposed as shown in FIG. 16. In some embodiments, ILD 190 can include $SiO_2$, SiOC, SiON, SiOCN, or SiCN deposited by CVD, physical vapor deposition (PVD), a thermally grown process, or any other appropriate deposition method.

In referring to FIG. 3B, method 300 continues with operation 345 and the process of removing sacrificial gate structure 800. In some embodiments, operation 345 includes a dual wet etching process during which polysilicon gate electrode 805 and sacrificial gate oxide 810 are removed sequentially. In some embodiments, sacrificial gate structure 800 can be removed with a first wet etching process designed to be selective towards polysilicon gate electrode 805. By way of example and not limitation, the selectivity of the first wet chemistry can be greater than about 1,000:1 (e.g., 10,000:1) so that gate spacers 185, sacrificial gate oxide 810, and ILD 190 are not removed by the first wet etching process. Since sacrificial gate oxide 810 is interposed between vertical nano-sheet layer structure 700 and polysilicon gate electrode 805, sacrificial gate oxide 810 can protect the SiGe/Si nano-sheet layers 135*a/b* of vertical nano-sheet layer structure 700 from being etched during the first wet etching process. A subsequent second wet etching process removes sacrificial gate oxide 810 without etching gate spacers 185, ILD 190, and vertical nano-sheet layer structure 700. In some embodiments, the second wet etching chemistry can be selective towards sacrificial gate oxide 810 so that surrounding materials, such as gate spacers 185, SiGe/Si nano-sheet layers 135*a/b* of vertical nano-sheet layer structure 700, and ILD 190 are not removed. In the event that the second etching chemistry can etch ILD 190, a capping layer or a hard mask can be formed on ILD 190 after operation 340 to protect ILD 190 from the second wet etching process. According to some embodiments, after the removal of sacrificial gate structure 800, the top surface and sidewall surfaces (e.g., parallel to the x-z plane) of vertical nano-sheet structure 700 are exposed.

In referring to FIG. 3B, method 300 continues with operation 350 and the process of removing the first nano-sheet layers (e.g., SiGe nano-sheet layers 135*a*) from vertical nano-sheet layer structure 700. Removal of SiGe nano-sheet layers 135*a* is achieved, for example, with an etching chemistry similar to the one used in operation 325 for the lateral etching of SiGe nano-sheet layers 135*a*. For example, in operation 350, SiGe nano-sheet layers 135*a* can be exposed to a halogen-based chemistry (e.g., fluorine-based and/or chlorine-based gases) until SiGe nano-sheet layers 135*a* are completely removed from vertical nano-sheet structure 700. After the removal of SiGe nano-sheet layers 135*a*, Si nano-sheet layers 135*b* become suspended between S/D epitaxial layers 110 as shown in FIG. 18.

Figure 18:
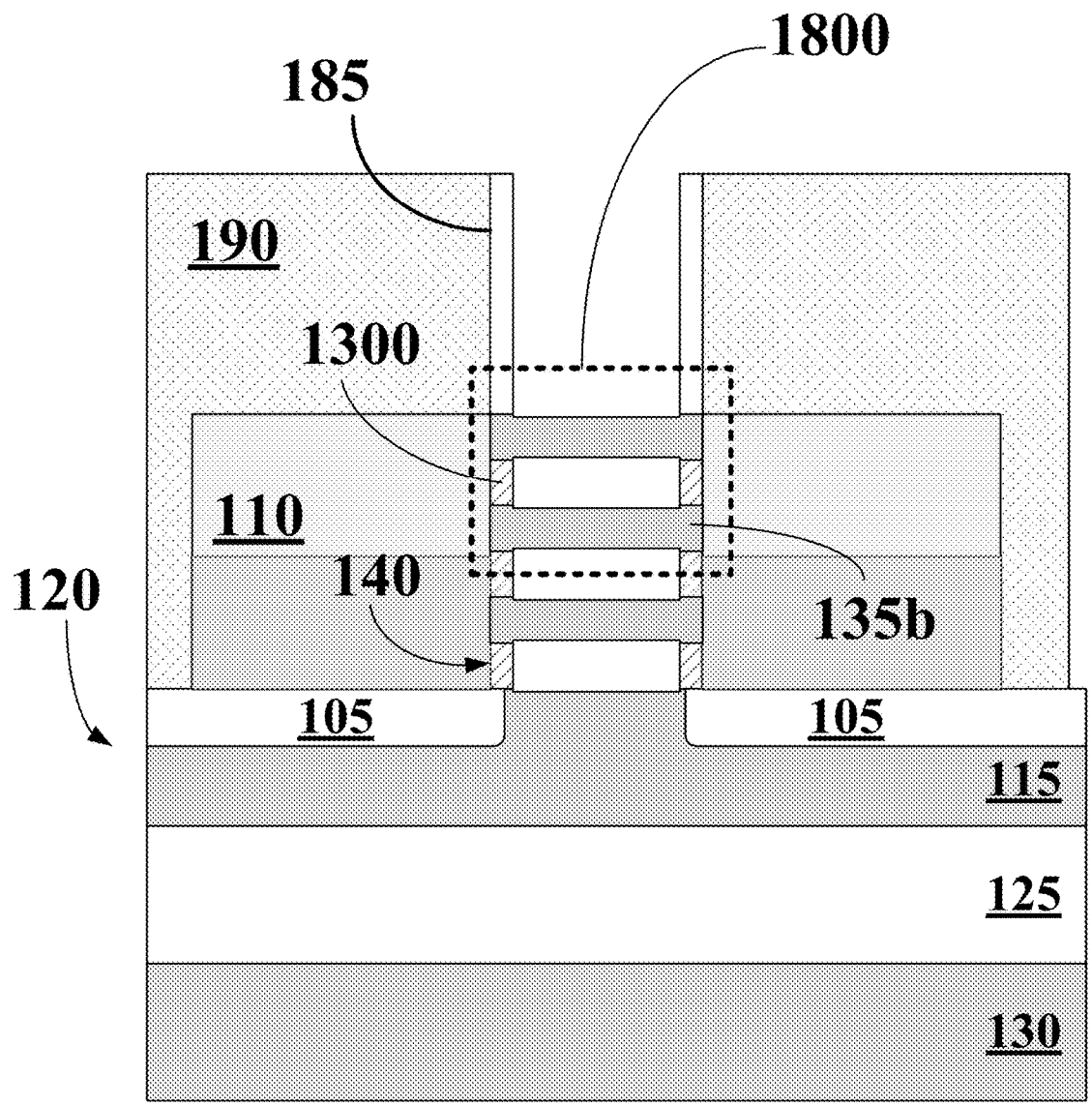
Figure 19:
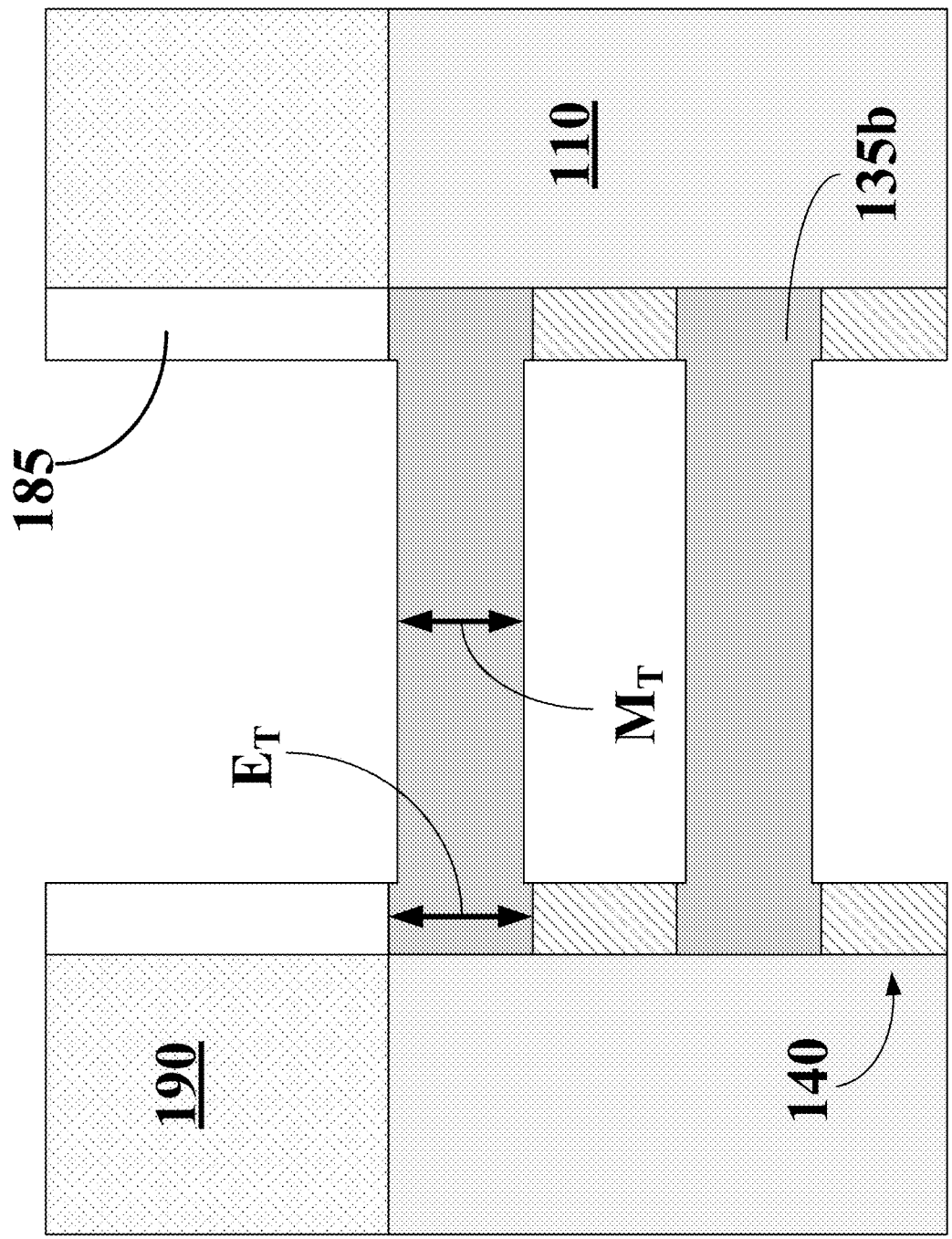

In some embodiments, surfaces of Si nano-sheet layers 135*b* may appear recessed (e.g., thinned) after operation 350 as shown in FIG. 19, which is a magnified view of section 1800 shown in FIG. 18. For example, middle portion thickness $M_T$ can be equal to or shorter than edge portion thickness $E_T$ of Si nano-sheet layers 135*b* (e.g., $E_T \geq M_T$). In some embodiments, the height difference between the middle and edge portions of Si nano-sheet layers 135*b* after operation 350 can be between about 2 and about 4 nm—for example, ($E_T - M_T$) is between about 2 and about 4 nm. In some embodiments, the aforementioned "thinning" of Si nano-sheet layers 135*b* during operation 350 is attributed to the selectivity of the etching gasses used in operation 350.

For example, the etching selectivity of the etching chemistry towards Si nano-sheet layers 135b may not be zero.

Figure 20:
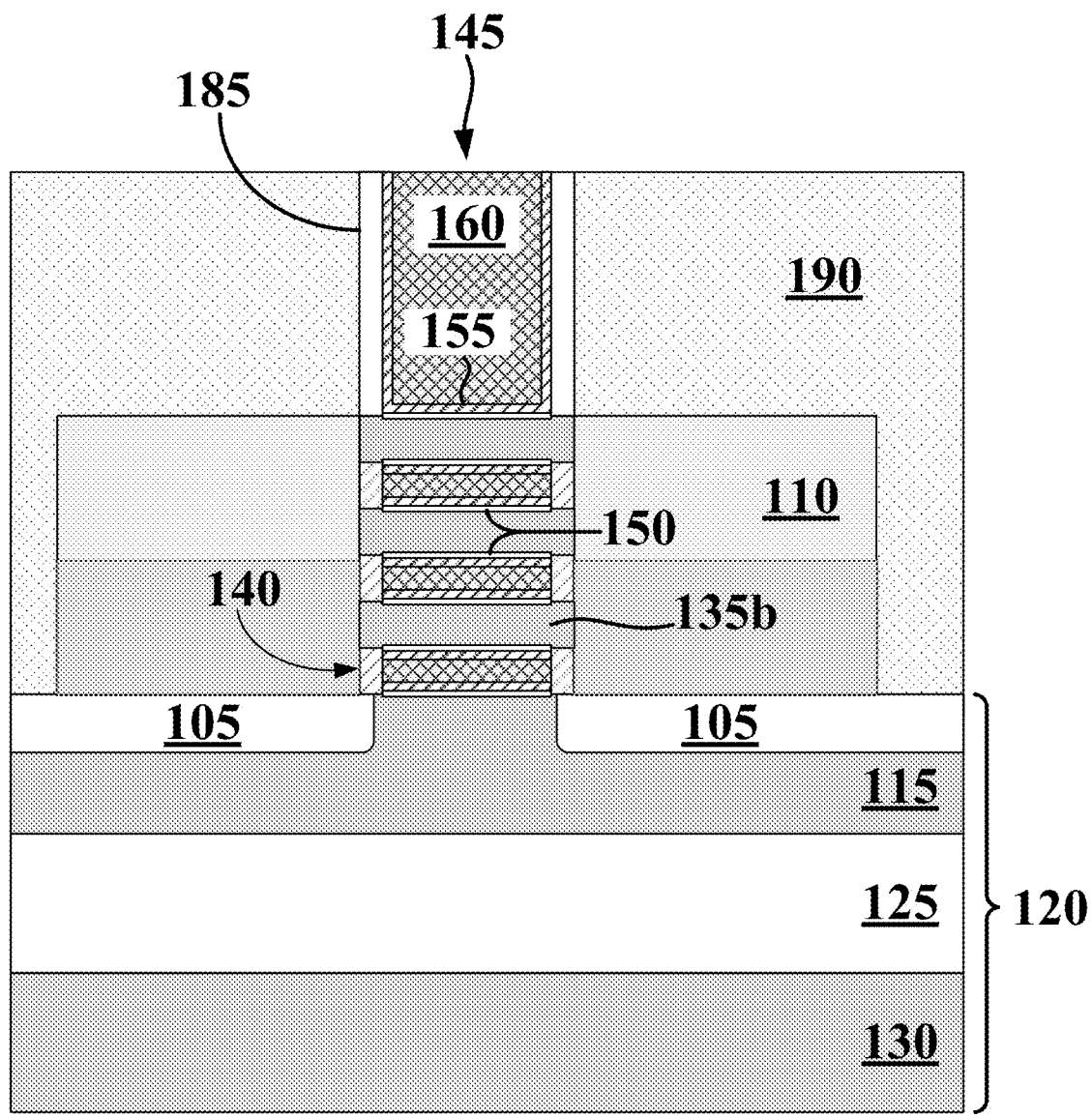

In referring to FIGS. 3B and 20, method 300 continues with operation 355 and the process of forming gate stack 145 around Si nano-sheet layers 135b. In some embodiments, IL 150 is formed first, followed by high-k dielectric 155, and gate electrode 160. By way of example and not limitation, IL 150 can include silicon oxide or a silicon oxy-nitride, high-k dielectric 155 can include doped or un-doped hafnium oxide ($HfO_2$), a hafnium silicate-based material, or another suitable dielectric with a k-value greater than 3.9. Further, gate electrode 160 may include a capping layer over high-k dielectric 155, one or more barrier layers, a work-function metal (WFM) stack, and a metal fill layer not shown in FIG. 20 for simplicity. The number and type of layers in the WFM stack in gate electrode 160 can modulate the threshold voltage of the GAA FET. By way of example and not limitation, the WFM stack can include tantalum nitride (TaN) layers, titanium nitride (TiN) layers, (Ti/Al) bi-layers, titanium-aluminum (Ti—Al) alloy layers, tantalum-aluminum (Ta—Al) alloy layers, or combinations thereof. The metal fill layer can include, for example, a TiN barrier layer and a tungsten (W) metal stack. The aforementioned list of materials for IL 150, high-k dielectric 155, and gate electrode 160 is not exhaustive; additional materials can be used, which are within the spirit and the scope of this disclosure.

In some embodiments, IL 150 and high-k dielectric 155 are formed thicker on Si nano-sheet layers 135b towards semiconductor layer 115. For example, the thickness of IL 150 and high-k dielectric 155 progressively decrease towards semiconductor layer 115. In some embodiments, the aforementioned thickness variation is attributed to the reactant transport characteristics during the deposition of IL 150 and high-k dielectric 155—for example, the reactants require longer times to reach surfaces close to semiconductor layer 115 and therefore produce thinner films. By way of example and not limitation, IL 150 can have a thickness between about 0.5 nm and about 1 nm and high-k dielectric 155 can have a thickness between about 1 nm and about 1.5 nm.

In some embodiments, after the formation of gate stack 145, a planarization process (e.g., a CMP process) removes excess deposited gate stack material on ILD 190 and planarizes the structure so that top surfaces of gate stack 145 and ILD 190 are substantially coplanar as shown in FIG. 20. Subsequently, S/D contacts 165 and silicide layers 170 can be formed on S/D epitaxial layers 110 as shown in FIG. 1.

In some embodiments, Si nano-sheet layers 135b can be removed to form suspended SiGe nano-sheet layers 135a. For example, in referring to FIG. 4, nano-sheet layers 135a can correspond to Si nano-sheet layers and nano-sheet layers 135b can correspond to SiGe nano-sheet layers. Subsequently, an etching chemistry selective to the Si nano-sheet layers can be used in operations 325 and 350 of method 300 shown in FIGS. 3A and 3B to respectively recess and remove the Si nano-sheet layers.

In some embodiments, isolation structures 105 can include a nitride or a carbide, such as silicon nitride (SiN), silicon carbide (SiC), and other suitable materials with a resistivity higher than about $1\times10^{10}$ Ohms·m. For example, in the case of silicon nitride isolation structures 105, a directional decoupled plasma nitridation (DPPN) process can be used to form a nitride layer in semiconductor layer 115 instead of an oxide layer. In some embodiments, isolation structures 105 can be formed with an implant process, an ALD process, a CVD process, or a physical vapor deposition (PVD) process (e.g., sputtering). For example, in the case of an ALD, a CVD, or a PVD process, isolation structures 105 can be formed on a top surface of semiconductor layer 115—e.g., not within semiconductor layer 115.

According to some embodiments, FIG. 21 is an alternative GAA FET formed with method 300. In FIG. 21, the GAA FET features Si nano-sheet layers 135b with progressively shorter lengths towards gate stack 145 and sloped S/D epitaxial layers 110. This can be achieved, for example, during operation 310 where the etching process used to etch the first and second nano-sheet layers (e.g., SiGe nano-sheet layers 135a and Si nano-sheet layers 135b respectively) is modified to form sloped sidewalls instead of substantially vertical sidewalls in vertical nano-sheet layer structure 700. Further, the GAA FET structure of FIG. 21 features isolation structures 105 with a semispherical shape. Implant processes, as discussed above, may produce isolation structures 105 with a semispherical shape. In some embodiments, semispherical isolation structures 105 can extend laterally (e.g., along the x-direction) under spacer structures 140 by an amount between about 1 nm and about 3 nm as indicated by dashed circle C. In some embodiments, the GAA FET structure of FIG. 21 has spacer structures 140 with convex sidewall surfaces—a result of the SiGe nano-sheet etching process discussed above with respect to FIG. 12.

The embodiments described herein are directed to methods for the fabrication of GAA FETs with a low power consumption that may not require substrate doping (e.g., counter-doping). In some embodiments, the isolation structures disclosed herein are interposed between the source/drain epitaxial layers of the GAA FET and the semiconductor substrate to mitigate or eliminate leakage currents and the need for substrate doping (e.g. counter-doping). In some embodiments, the isolation structures are formed with a DDPO process, a DDPN process, an implant process, an ALD process, a CVD process, or a PVD process. In some embodiments, the isolation structures are thicker than about 10 nm and include a dielectric with an electrical resistivity greater than about $1\times10^{10}$ Ohms·m. In some embodiments, the isolation structures have a substantially rectangular shape or a substantially semispherical shape.

In some embodiments, semiconductor structure includes a semiconductor layer with a first S/D epitaxial structure and a second S/D epitaxial structure disposed thereon, where the first and second S/D epitaxial structures are spaced apart by semiconductor nano-sheet layers. The semiconductor structure further includes: isolation structures interposed between the semiconductor layer and each of the first and second S/D epitaxial structures; and a gate stack surrounding the semiconductor nano-sheet layers.

In some embodiments, a semiconductor structure includes: a semiconductor layer with a pair of S/D epitaxial structures having opposed sloped inner sidewalls disposed on the semiconductor layer; nano-sheet layers connecting the sloped inner sidewalls of the pair of S/D epitaxial structures; and isolation structures interposed between the semiconductor layer and the pair of S/D epitaxial structures. The semiconductor structure further includes a gate stack surrounding the nano-sheet layers.

In some embodiments, a method includes: forming a vertical structure with alternating first and second nano-sheet layers on a semiconductor layer; forming a first gate structure around a middle portion of the vertical structure and on a portion of the semiconductor layer, where edge portions of the vertical structure are not covered by the gate structure. The method also includes removing the edge portions of the vertical structure and etching, in a lateral direction, edge portions of the first nano-sheet layers from the vertical structure. Further, the method includes forming a spacer structure abutting each etched edge portion of the first nano-sheet layers, and further forming isolation structures in a top portion of the semiconductor layer not covered by the first gate structure. Additionally, the method includes forming a S/D epitaxial layer on each isolation structure, where edge portions of the second nano-sheet layers are in contact with the S/D epitaxial layer, and removing the first gate structure from the vertical structure. The method also includes removing the first nano-sheet layers from the vertical structure and forming a second gate structure around the second nano-sheet layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a vertical structure on a semiconductor layer, the vertical structure comprising alternating first and second nanostructured layers;
    forming a first gate structure around a middle portion of the vertical structure and on a portion of the semiconductor layer, wherein edge portions of the vertical structure are not covered by the first gate structure;
    removing the edge portions of the vertical structure;
    etching, in a lateral direction, edge portions of the first nanostructured layers from the vertical structure;
    forming a spacer structure abutting each etched edge portion of the first nanostructured layers;
    converting a top portion of the semiconductor layer not covered by the first gate structure into isolation structures;
    forming a source/drain (S/D) epitaxial layer on each of the isolation structures, wherein edge portions of the second nanostructured layers are in contact with the S/D epitaxial layer;
    removing the first gate structure from the vertical structure;
    removing the first nanostructured layers from the vertical structure; and
    forming a second gate structure around the second nanostructured layers.

2. The method of claim 1, wherein converting the top portion of the semiconductor layer comprises performing a directional oxidation or a nitridation process.

3. The method of claim 1, wherein forming the spacer structure comprises:
    depositing a capping layer on the first gate structure and on the etched edge portions of the first nanostructured layers, wherein portions of the capping layer not abutting the etched edge portions of the first nanostructured layers are oxidized during formation of the isolation structures; and
    removing the oxidized portions of the capping layer to form the spacer structure.

4. The method of claim 1, wherein converting the top portion of the semiconductor layer comprises forming at least a 10 nm thick oxide or nitride in the top portion of the semiconductor layer having an electrical resistivity greater than about $1\times10^{10}$ Ohms·m.

5. A method, comprising:
    forming a stack of first and second nanostructured layers in an alternating configuration on a substrate;
    depositing a dielectric layer on sidewalls of the first and second nanostructured layers and on the substrate;
    oxidizing portions of the dielectric layer on the sidewalls of the first nanostructured layers and on the substrate to form oxidized layers on the sidewalls of the first nanostructured layers and on the substrate;
    forming a source/drain (S/D) region adjacent to the first nanostructured layers; and
    replacing the second nanostructured layers with a gate structure.

6. The method of claim 5, further comprising removing the oxidized portions of the dielectric layer on the sidewalls of the first nanostructured layers.

7. The method of claim 5, further comprising oxidizing a portion of the substrate under the dielectric layer prior to oxidizing the portions of the dielectric layer.

8. The method of claim 7, wherein oxidizing the portion of the substrate comprises oxidizing a substrate region extending below the first nanostructured layers.

9. The method of claim 7, wherein oxidizing the portion of the substrate comprises performing a directional decoupled plasma oxidation process on the portion of the substrate through the dielectric layer.

10. The method of claim 5, further comprising forming a nitride layer in a portion of the substrate under the dielectric layer.

11. The method of claim 5, further comprising performing a nitridation process on a portion of the substrate under the dielectric layer.

12. The method of claim 5, further comprising etching, in a lateral direction, edge portions of the second nanostructured layers prior to depositing the dielectric layer.

13. The method of claim 5, further comprising etching the oxidized portions of the dielectric layer on the sidewalls of the first nanostructured layers and on the substrate.

14. A method, comprising:
    forming a semiconductor layer on a substrate;
    etching the semiconductor layer to form a raised region;
    forming a first nanostructured layer directly on a first portion of the raised region of the semiconductor layer;
    forming a second nanostructured layer directly on the first nanostructured layer;
    forming a sacrificial structure on the first and second nanostructured layers;
    forming an isolation structure on a second portion of the raised region of the semiconductor layer, wherein forming the isolation structure comprises converting a top portion of the second portion of the raised region into the isolation structure;
    forming a source/drain (S/D) region on the isolation structure; and
    replacing the sacrificial structure and the first nanostructured layer with a gate structure surrounding the second nanostructured layer.

15. The method of claim 14, wherein converting the top portion of the second portion of the raised region of the semiconductor layer comprises performing an oxidation process on the second portion of the raised region of the semiconductor layer.

16. The method of claim 14, wherein converting the top portion of the second portion of the raised region of the semiconductor layer comprises performing a nitridation process on the second portion of the raised region of the semiconductor layer.

17. The method of claim 14, further comprising depositing a silicon-based capping layer on the second portion of the raised region of the semiconductor layer prior to forming the isolation structure.

18. The method of claim 14, further comprising depositing a silicon-based capping layer on sidewalls of the first and second nanostructured layers.

19. The method of claim 14, further comprising forming spacers along sidewalls of the second nanostructured layer prior to forming the S/D region.

20. The method of claim 14, wherein the first nanostructured layer comprises a silicon-germanium layer and the second nanostructured layer comprises a silicon layer.

* * * * *